United States Patent
Connell et al.

(10) Patent No.: US 12,124,289 B2
(45) Date of Patent: Oct. 22, 2024

(54) MULTI-PHASE SIGNAL GENERATION

(71) Applicant: Huawei Technologies Co., Ltd., Shenzhen (CN)

(72) Inventors: Lawrence E. Connell, Naperville, IL (US); Timothy McHugh, Wheaton, IL (US); Ramesh Chadalawada, Superior, CO (US); Brian Iehl, Hoffman Estates, IL (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/460,344

(22) Filed: Sep. 1, 2023

(65) Prior Publication Data

US 2023/0418323 A1 Dec. 28, 2023

Related U.S. Application Data

(63) Continuation of application No. 17/089,390, filed on Nov. 4, 2020, now Pat. No. 11,782,475, which is a
(Continued)

(51) Int. Cl.
*G06F 1/08* (2006.01)
*G06F 1/06* (2006.01)
(Continued)

(52) U.S. Cl.
CPC .................. *G06F 1/08* (2013.01); *G06F 1/06* (2013.01); *H03K 5/1515* (2013.01); *H04B 1/0475* (2013.01)

(58) Field of Classification Search
CPC ...................................... G06F 1/06; G06F 1/08
See application file for complete search history.

(56) References Cited

U.S. PATENT DOCUMENTS

| 5,867,046 A | 2/1999 | Sugasawa |
| 6,342,821 B1 | 1/2002 | Kim |

(Continued)

FOREIGN PATENT DOCUMENTS

| CN | 1565081 A | 1/2005 |
| CN | 101018051 A | 8/2007 |

(Continued)

OTHER PUBLICATIONS

Preliminary Amendment dated Jul. 20, 2021, U.S. Appl. No. 17/089,390.
(Continued)

*Primary Examiner* — Phil K Nguyen
(74) *Attorney, Agent, or Firm* — Vierra Magen Marcus LLP

(57) ABSTRACT

The disclosure relates to technology for generating multi-phase signals. An apparatus includes $2^n$ phase signal generation stages. The apparatus also includes a controller configured to provide a mode input of each of the $2^n$ stages with an active periodic binary signal with remaining inputs of each of the $2^n$ stages provided with another periodic binary signal to collectively generate a $2^n$ phase signal in a first mode. The controller is further configured to provide the mode input of each of $2^{(n-1)}$ odd stages with a first steady state signal and the mode input of each of $2^{(n-1)}$ even stages with a second steady state signal with remaining inputs of each of the $2^n$ stages provided with the same periodic binary signal as in the first mode to cause either the $2^{(n-1)}$ odd stages or the $2^{(n-1)}$ even stages to collectively generate a $2^{(n-1)}$ phase signal in a second mode.

18 Claims, 17 Drawing Sheets

Related U.S. Application Data continuation of application No. PCT/CN2019/098052, filed on Jul. 27, 2019, which is a continuation of application No. 16/054,886, filed on Aug. 3, 2018, now Pat. No. 10,678,296.

(51) Int. Cl.
*H03K 5/151* (2006.01)
*H04B 1/04* (2006.01)

(56) References Cited

U.S. PATENT DOCUMENTS

| | | | |
|---|---|---|---|
| RE38,482 E | 3/2004 | Leung | |
| 7,741,926 B2* | 6/2010 | Kodama | H03B 21/02 |
| | | | 375/135 |
| 8,723,568 B1 | 5/2014 | Terrovitis | |
| 9,276,615 B1* | 3/2016 | Filippov | H03D 7/005 |
| 9,900,030 B2 | 2/2018 | Jiang et al. | |
| 10,333,763 B1 | 6/2019 | Jiang et al. | |
| 10,678,296 B2 | 6/2020 | Connell et al. | |
| 2001/0030565 A1 | 10/2001 | Ebuchi et al. | |
| 2003/0016762 A1 | 1/2003 | Martin et al. | |
| 2004/0125888 A1* | 7/2004 | Cho | H03C 3/40 |
| | | | 375/298 |
| 2004/0141343 A1 | 7/2004 | Lin | |
| 2005/0059376 A1 | 3/2005 | Davis | |
| 2006/0001496 A1 | 1/2006 | Abrosimov | |
| 2006/0055443 A1 | 3/2006 | Suzuki | |
| 2006/0252396 A1 | 11/2006 | Barak et al. | |
| 2009/0108945 A1 | 4/2009 | Kodama et al. | |
| 2010/0117692 A1 | 5/2010 | Yoon | |
| 2011/0181325 A1 | 7/2011 | May | |
| 2011/0286510 A1 | 11/2011 | Levantino | |
| 2012/0008713 A1 | 1/2012 | Ebuchi et al. | |
| 2012/0056644 A1 | 3/2012 | Kondou | |
| 2012/0099633 A1* | 4/2012 | Casagrande | H03L 7/0807 |
| | | | 375/226 |
| 2012/0216084 A1 | 8/2012 | Chun et al. | |
| 2013/0007500 A1 | 1/2013 | Fiedler | |
| 2013/0049831 A1 | 2/2013 | Nedachi | |
| 2013/0214816 A1 | 8/2013 | Thornton | |
| 2014/0077876 A1* | 3/2014 | Feygin | H03G 3/004 |
| | | | 330/127 |
| 2014/0321576 A1* | 10/2014 | Mirzaei | H04B 1/0483 |
| | | | 375/296 |
| 2014/0355655 A1* | 12/2014 | Chakraborty | H04B 1/40 |
| | | | 375/219 |
| 2015/0244350 A1 | 8/2015 | Wang | |
| 2015/0301552 A1 | 10/2015 | Lim | |
| 2017/0302308 A1 | 10/2017 | Jiang et al. | |
| 2017/0324414 A1 | 11/2017 | Bagger | |
| 2018/0131323 A1 | 5/2018 | Shu et al. | |
| 2019/0044453 A1 | 2/2019 | Nikitin | |
| 2019/0072657 A1* | 3/2019 | Delos | H01Q 3/2682 |
| 2019/0393838 A1 | 12/2019 | Papageorgiou | |
| 2021/0048839 A1 | 2/2021 | Connell et al. | |

FOREIGN PATENT DOCUMENTS

| | | |
|---|---|---|
| CN | 101127527 A | 2/2008 |
| CN | 101800541 A | 8/2010 |
| CN | 102355257 A | 2/2012 |
| CN | 102788983 A | 11/2012 |
| CN | 103929173 A | 7/2014 |
| CN | 102832929 B | 3/2015 |
| CN | 103944544 B | 1/2017 |
| CN | 106571777 A | 4/2017 |
| JP | 4233985 B2 | 3/2009 |
| WO | 2018082662 A1 | 5/2018 |

OTHER PUBLICATIONS

Non-Final Office Action dated Feb. 16, 2023, U.S. Appl. No. 17/089,390.
Response to Non-Final Office Action dated May 9, 2023, U.S. Appl. No. 17/089,390.
Notice of Allowance dated Jun. 1, 2023, U.S. Appl. No. 17/089,390.
Notice of Allowance dated Feb. 6, 2020, U.S. Appl. No. 16/054,886, filed Aug. 3, 2018.
International Search Report and Written Opinion of the International Searching Authority dated Oct. 12, 2019, International Application No. PCT/CN2019/098052.
Ka-Fai Un et al., Analysis and Design of Open-Loop Multiphase Local-Oscillator Generator for Wireless Applications, IEEE Transaction on Circuits and Systems—I: Regular Papers, vol. 57, No. 5, May 2010, total 12 pages.

* cited by examiner

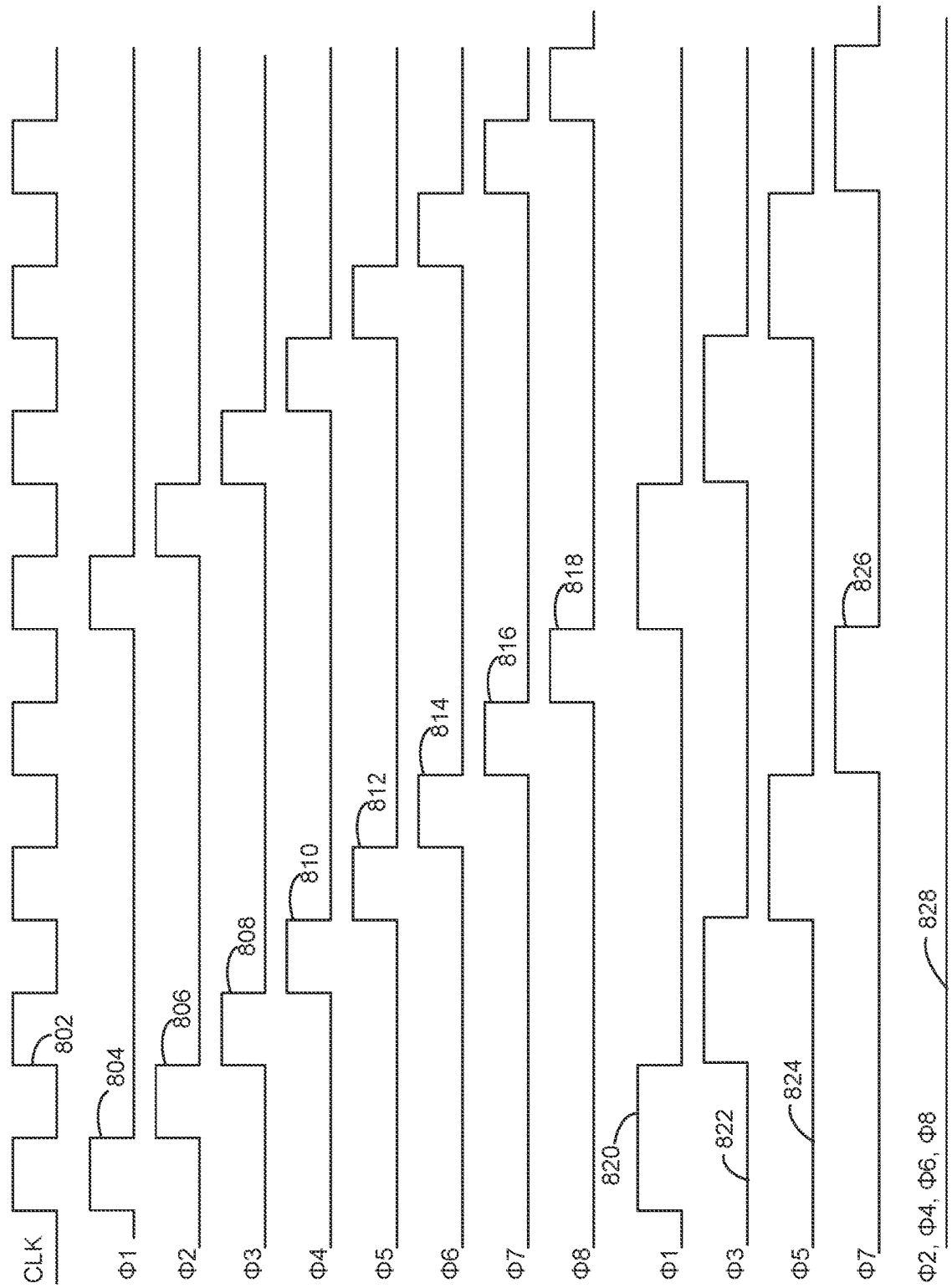

1300

Provide a mode input of each of 2^n phase signal generation stages with an active periodic binary signal with each remaining input provided with another periodic binary signal to generate 2^n phase signals in a first mode, 1302

Provide the mode input of each of the 2^n stages with a steady state signal with remaining inputs of each of the 2^n stages having the same periodic binary signal as in the first mode to generate 2^(n-1) phase signals in a second mode, 1304

Divide frequency of clock signal to produce periodic binary signals, 1402

Provide a first version of the clock signal as active periodic binary signal to the mode input of the 2^(n-1) odd stages, 1404

Provide a second version of the clock signal as active binary signal to the mode input of the 2^(n-1) even stages, 1406

*FIG.14*

MULTI-PHASE SIGNAL GENERATION

CLAIM FOR PRIORITY

This application is a continuation of, and claims priority to, U.S. patent application Ser. No. 17/089,390, entitled "MULTI-PHASE SIGNAL GENERATION", filed Nov. 4, 2020, published as U.S. Publication No. 2021/0048839 published Feb. 18, 2021, which is a continuation of, and claims priority to, PCT/CN2019/098052, entitled "MULTI-PHASE SIGNAL GENERATION", filed Jul. 27, 2019, which claims the benefit of priority to U.S. application Ser. No. 16/054,886, entitled "MULTI-PHASE SIGNAL GENERATION", filed Aug. 3, 2018, issued as U.S. Pat. No. 10,678,296 on Jun. 9, 2020, the entire contents of which are hereby incorporated by reference.

FIELD

The disclosure generally relates to generation of multi-phase signals.

BACKGROUND

Multi-phase signals have a wide variety of uses in electronic systems. An n-phase signal includes "n" separate phase signals, each of which is a different phase of the n-phase signal. Multi-phase signals may be used in wireless transmitters, as well as wireless receivers. In some situations, it can be useful to generate multi-phase signals having a different number phase signals. One example is to generate a four-phase local oscillator signal, as well as an eight-phase local oscillator signal, in a wireless communication device.

BRIEF SUMMARY

According to a first aspect of the present disclosure, there is provided an apparatus comprising $2^n$ phase signal generation stages each comprising a plurality of inputs that include a mode input. The $2^n$ stages comprise $2^{(n-1)}$ odd stages and $2^{(n-1)}$ even stages, where "n" is an integer greater than 1. The apparatus also includes a controller configured to provide the mode input of each of the $2^n$ stages with an active periodic binary signal with remaining inputs of each of the $2^n$ stages provided with another periodic binary signal to collectively generate a $2^n$ phase signal in a first mode. The controller is further configured to provide the mode input of each of the $2^{(n-1)}$ odd stages with a first steady state signal and the mode input of each of the $2^{(n-1)}$ even stages with a second steady state signal with remaining inputs of each of the $2^n$ stages provided with the same periodic binary signal as in the first mode to cause either the $2^{(n-1)}$ odd stages or the $2^{(n-1)}$ even stages to collectively generate a $2^{(n-1)}$ phase signal in a second mode.

Using the same periodic binary signals in both the first mode and the second mode in combination with using the first and second steady state signals in the second mode instead of the active periodic binary signal in the first mode may result in a deterministic phase relationship between phase signals in the first and second modes. A deterministic phase relationship between phase signals in the first and second modes facilitates transitions between the first and second modes in real time. Additionally, less power may be consumed in the second mode than in the first mode.

Optionally, in a second aspect in furtherance of the first aspect, the apparatus further comprises a frequency divider configured to divide a frequency of a clock signal to produce the other periodic binary signals.

Optionally, in a third aspect in furtherance of either the first or second aspects, the apparatus further comprises a buffer, and a clock generator connected to the buffer. The clock generator is configured to provide the clock signal through the buffer in both the first mode and in the second mode. Therefore, the buffer provides the same load on the clock generator in the first mode and in the second mode. Maintaining the same load on the clock generator in each mode may allow circuitry such as a PLL in the clock generator to settle faster, which may facilitate transitions between the first and second modes in real time.

Optionally, in a fourth aspect in furtherance of any of the second to third aspects, the controller is further configured to provide a first version of the clock signal as the active periodic binary signal to the mode input for the $2^{(n-1)}$ odd stages. The controller is further configured to provide a second version of the clock signal as the active periodic binary signal to the mode input for the $2^{(n-1)}$ even stages.

Optionally, in a fifth aspect in furtherance of any of the second to fourth aspects, the controller is further configured to switch between providing the mode input of each of the $2^{(n-1)}$ odd stages with the first version of the clock signal and the first steady state signal to transition the $2^{(n-1)}$ odd stages between the first mode and the second mode. The controller is further configured to switch between providing the mode input of each of the $2^{(n-1)}$ even stages with the second version of the clock signal and the second steady state signal to transition the $2^{(n-1)}$ even stages between the first mode and the second mode.

Optionally, in a sixth aspect in furtherance of any of the second to fifth aspects, the frequency divider comprises one or more master-slave flip-flops that generate the other periodic binary signals based on the clock signal. The other periodic binary signals comprise master periodic binary signals from a master in each of the one or more master-slave flip-flops and slave periodic binary signals from a slave in each of the one or more master-slave flip-flops. The master periodic binary signals are provided to the $2^{(n-1)}$ odd stages in both the first mode and in the second mode. The slave periodic binary signals are provided to the $2^{(n-1)}$ even stages in both the first mode and in the second mode.

Optionally, in a seventh aspect in furtherance of any of the first to sixth aspects, the apparatus further comprises a frequency mixer having a signal input configured to receive an input signal, an oscillator input configured to receive the $2^n$ phase signal in the first mode and to receive the $2^{(n-1)}$ phase signal in the second mode, and a signal output configured to provide an output signal based on the input signal and the $2^n$ phase signal in the first mode and the $2^{(n-1)}$ phase signal in the second mode. The apparatus further comprises a radio frequency (RF) output configured to transmit the output signal. The apparatus further comprises a mode selector configured to instruct the controller to operate the $2^n$ phase signal generation stages in the first mode in response to power of the RF output being above a threshold and to operate the $2^n$ phase signal generation stages in the second mode in response to power of the RF output being below the threshold. When the transmitter power is higher, there may be a greater need to reduce frequency mixer induced distortion. Providing the $2^n$ phase signal to the frequency mixer when the transmitter power is above a threshold may help to reduce frequency mixer induced distortion. When the transmitter power is lower, the need to reduce the frequency mixer induced distortion may be reduced. Using $2^{n-1}$ phase signal may reduce power consumption (due to generating fewer phase signals) when the requirement for reducing frequency mixer induced distortion is reduced.

Optionally, in an eighth aspect in furtherance of any of the first to seventh aspects, "n" is 3.

Optionally, in a ninth aspect in furtherance of any of the first to eighth aspects, each of the other periodic binary signals provided to the remaining inputs of each of the $2^n$ stages have the same frequency but are shifted from each other in phase.

According to a tenth aspect of the present disclosure, there is provided a method comprising providing a mode input of each of $2^n$ phase signal generation stages with an active periodic binary signal with remaining inputs of each of the $2^n$ stages provided with another periodic binary signal to collectively generate a $2^n$ phase signal in a first mode. The $2^n$ stages comprising $2^{(n-1)}$ odd stages and $2^{(n-1)}$ even stages, where "n" is an integer greater than 1. The method also comprises providing the mode input of each of the $2^{(n-1)}$ odd stages with a first steady state signal and the mode input of each of the $2^{(n-1)}$ even stages with a second steady state signal with remaining inputs of each of the $2^n$ stages provided with the same periodic binary signal as in the first mode to cause either the $2^{(n-1)}$ odd stages or the $2^{(n-1)}$ even stages to collectively generate a $2^{(n-1)}$ phase signal in a second mode.

Optionally, in an eleventh aspect in furtherance of the tenth aspect, the method further comprises dividing a frequency of a clock signal to produce the other periodic binary signals. Each of the other periodic binary signals having the same frequency but shifted from each other in phase.

Optionally, in a twelfth aspect in furtherance of the eleventh aspect, providing the mode input of each of the $2^n$ phase signal generation stages with the active periodic binary signal comprises: providing a first version of the clock signal to the mode input of each of the $2^{(n-1)}$ odd stages; and providing a second version of the clock signal to the mode input of each of the $2^{(n-1)}$ even stages.

Optionally, in a thirteenth aspect in furtherance of the eleventh or twelfth aspect, the method further comprises switching between providing the mode input of each of the $2^{(n-1)}$ odd stages with the first version of the clock signal and the first steady state signal to transition the $2^{(n-1)}$ odd stages between the first mode and the second mode while the other periodic binary signals are maintained at the remaining inputs of each of the $2^{(n-1)}$ odd stages. The method also comprises switching between providing the mode input of each of the $2^{(n-1)}$ even stages with the second version of the clock signal and the second steady state signal to transition the $2^{(n-1)}$ even stages between the first mode and the second mode while the other periodic binary signals are maintained at the remaining inputs of each of the $2^{(n-1)}$ even stages.

Optionally, in a fourteenth aspect in furtherance of any of the eleventh to thirteenth aspects, dividing the frequency of the clock signal to produce the other periodic binary signals is performed by a frequency divider. The method further comprises providing the clock signal from a clock generator to the frequency divider along the same electrical path in both the first mode and in the second mode in order to maintain the same load on the clock generator in both the first mode and the second mode.

Optionally, in a fifteenth aspect in furtherance of any of the tenth to fourteenth aspects, the method further comprises: receiving an input signal at a frequency mixer; receiving the $2^n$ phase signal at the frequency mixer in the first mode; and receiving the $2^{(n-1)}$ phase signal at the frequency mixer in the second mode. The method further comprises generating an output signal, by the frequency mixer, based on the input signal and the $2^n$ phase signal for the first mode and based on the input signal and the $2^{(n-1)}$ phase signal for the second mode. The method further comprises transmitting the output signal by a radio frequency (RF) output; generating the $2^n$ phase signal in response to power of the RF output being above a threshold; and generating the $2^{(n-1)}$ phase signal in response to power of the RF output being below the threshold.

According to a sixteenth aspect of the present disclosure, there is provided a signal processing circuit comprising: a clock generator configured to generate a clock signal; a frequency divider configured to divide a frequency of the clock signal to produce periodic binary signals; and eight phase signal generation stages each comprising a plurality of inputs that include a mode input. The eight phase signal generation stages comprise four odd stages and four even stages. The signal processing circuit further comprises a controller configured to provide the mode input of each of the eight stages with a version of the clock signal with remaining inputs of each of the eight stages provided with one of the periodic binary signals to collectively generate an eight-phase signal for an eight-phase mode. The eight-phase signal includes four odd phase signals generated by respective ones of the four odd stages and four even phase signals generated by respective ones of the four even stages. The controller is configured to provide the mode input of each of the four odd stages with a first steady state signal and to provide the mode input of each of the four even stages with a second steady state signal with remaining inputs of each of the eight stages provided with the same periodic binary signal as in the eight-phase mode to cause either the four odd stages or the four even stages to collectively generate a four-phase signal for a four-phase mode.

Optionally, in a seventeenth aspect in furtherance of the sixteenth aspect, the signal processing circuit further comprises a buffer coupled to a phase-locked loop in the clock generator. The clock generator is configured to provide the clock signal to the frequency divider through the buffer in both the eight-phase mode and in the four-phase mode in order to maintain the same load on the phase-locked loop in both the eight-phase mode and the four-phase mode.

Optionally, in an eighteenth aspect in furtherance of the sixteenth or seventeenth aspects, the signal processing circuit further comprises a frequency mixer having a signal input configured to receive an input signal, an oscillator input configured to receive the eight-phase signal in the eight-phase mode and to receive the four-phase signal in the four-phase mode, and a signal output configured to provide an output signal based on the input signal and the eight-phase signal for the eight-phase mode and the four-phase signal for the four-phase mode. The signal processing circuit further comprises a radio frequency (RF) output configured to transmit the output signal. The signal processing circuit further comprises a mode selector configured to instruct the controller to operate the eight phase signal generation stages in the eight-phase mode in response to power of the RF output being above a threshold and to operate the eight phase signal generation stages in the four-phase mode in response to power of the RF output being below the threshold.

Optionally, in a nineteenth aspect in furtherance of any of the sixteenth to eighteenth aspects, the eight-phase signal comprises eight non-overlapping phase signals, each being a different phase of the eight-phase signal. The four-phase signal comprises four non-overlapping phase signals, each being a different phase of the four-phase signal.

Optionally, in a twentieth aspect in furtherance of any of the sixteenth to nineteenth aspects, the frequency divider is configured to divide the frequency of the clock signal by four. Each of the periodic binary signals has a frequency that is ¼ the clock frequency but shifted from each other in phase.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

FIG. 8 depicts example waveforms for one embodiment of the circuit of FIG. 7.

FIG. 13 is a flowchart of one embodiment of a process of operating a phase signal generation circuit.

FIG. 14 is a flowchart of one embodiment of a process of providing periodic binary signals to phase signal generation stages.

DETAILED DESCRIPTION

The present disclosure will now be described with reference to the figures, which in general relate to an apparatus, circuit and method for multi-phase signal generation.

One embodiment includes an apparatus that generates a $2^n$ phase signal in a first mode and a $2^{(n-1)}$ phase signal in a second mode. In one embodiment, the $2^n$ phase signal includes $2^n$ separate signals, each of which is a different phase of the $2^n$ phase signal. The $2^n$ separate signals may be referred to as "phase signals." Each of the $2^n$ separate signals is a binary periodic signal, in one embodiment. A binary periodic signal is a periodic wave in which the amplitude alternates between a fixed minimum value and a fixed maximum value. A binary periodic signal may also be referred to as a "pulse wave" or as a "rectangular wave." In one embodiment, the $2^{(n-1)}$ phase signal includes $2^{(n-1)}$ phase signals, each of which is a different phase of the $2^{(n-1)}$ phase signal. Each of the $2^{(n-1)}$ phase signals is a binary periodic signal, in one embodiment.

In one embodiment, the apparatus generates a four-phase signal in the first mode and an eight-phase signal in the second mode. The apparatus may be a wireless communication device, in which case the four-phase signal and the eight-phase signal might be provided to a frequency mixer of the wireless communication device at different times. The eight-phase signal may be beneficial in reducing distortion when transmit power is higher. At lower transmit power, the eight-phase signal might not be needed to reduce distortion. One possibility is to use the eight-phase signal when transmit power is higher in order to meet distortion requirements, but to use the four-phase signal when transmit power is lower in order to reduce power consumption. Since transmit power can change during, for example, a cellular phone call, it can be beneficial to be able to change between a $2^{(n-1)}$ phase signal and $2^n$ phase signal in real time.

Figure 6A:
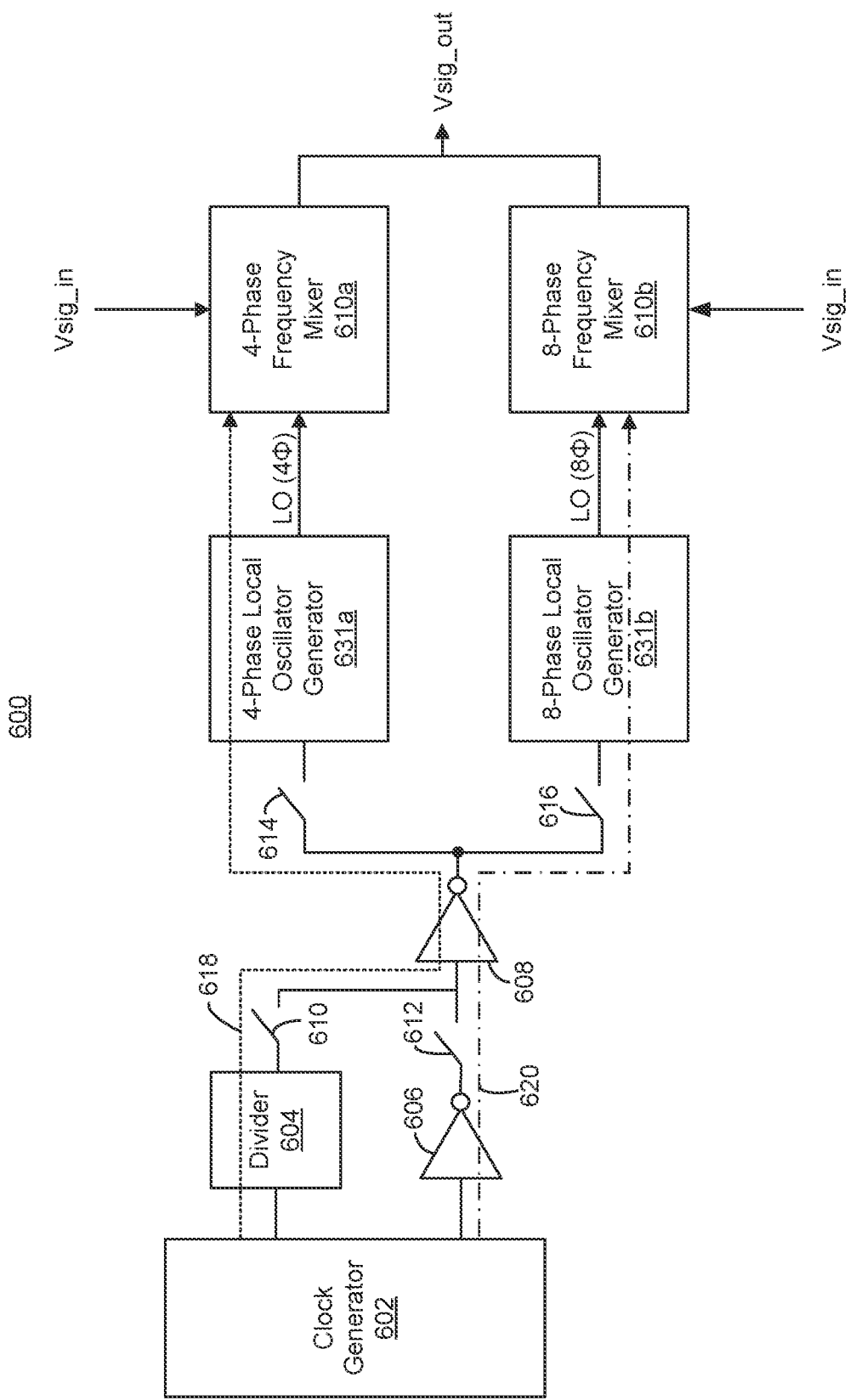
FIG. 6A is a diagram of a circuit for shifting a frequency of a signal.
Figure 6B:
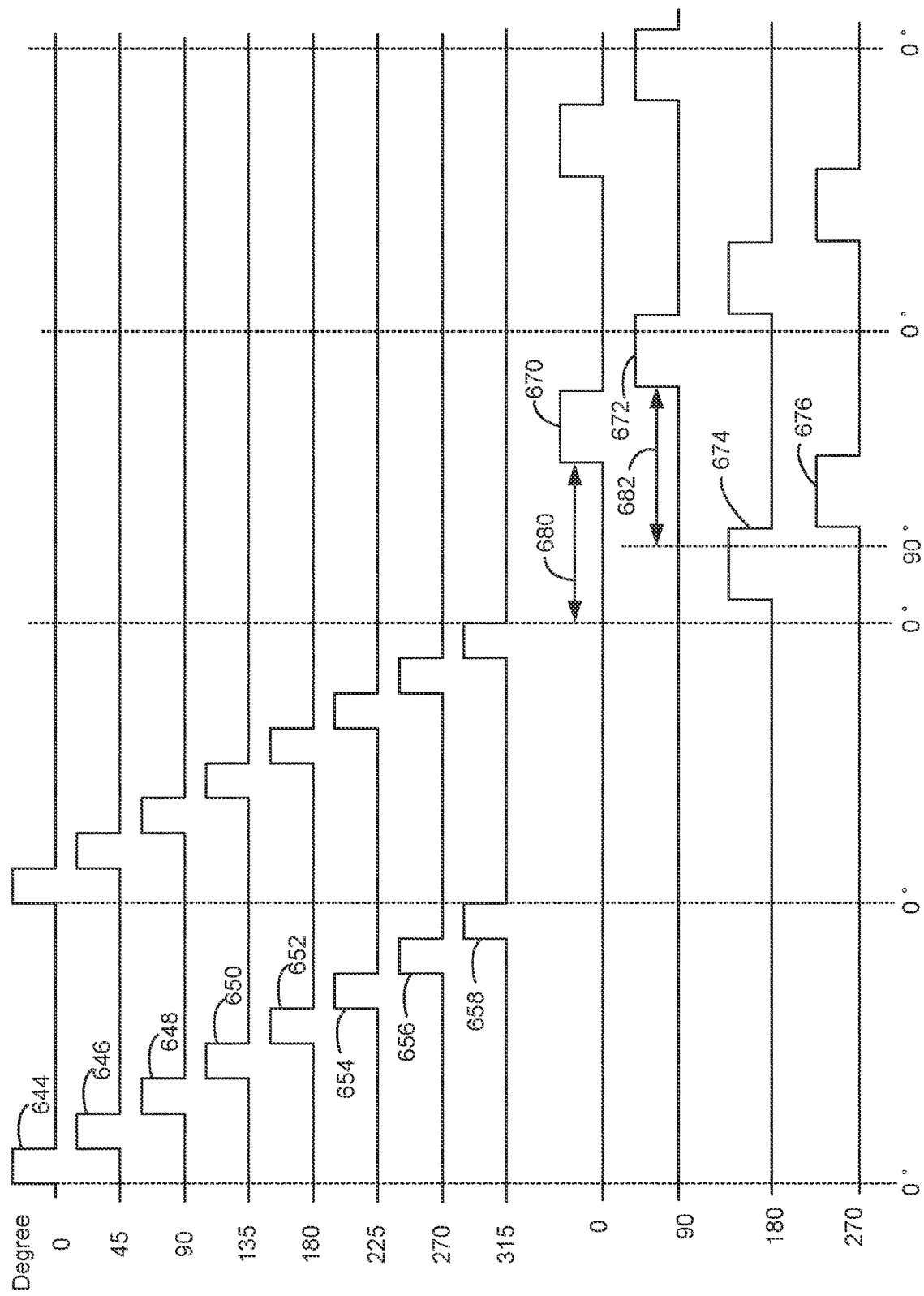
FIG. 6B depicts an example of local oscillator signals for the circuit of FIG. 6A.

In some electronic devices, there may be an indeterministic phase shift when transitioning between generating an eight-phase signal and a four-phase signal. Briefly, FIG. 6B depicts one example of an indeterministic phase shift when transitioning from an eight-phase signal to a four-phase signal. Specifically, FIG. 6B shows an eight-phase signal having waveforms 644-658. Each of the waveforms 644-658 may be referred to as a phase signal. Each of the phase signals 644-658 is a different phase of the eight-phase signal. FIG. 6B also shows a four-phase signal having waveforms 670-676. Each of the waveforms 670-676 may be referred to as a phase signal. Each of the phase signals 670-676 is a different phase of the four-phase signal. Each phase signal is associated with a degree. For example, phase signal 644 of the eight-phase signal is associated with 0 degrees. Likewise, phase signal 670 of the four-phase signal is associated with 0 degrees. FIG. 6B depicts five dashed vertical lines labeled 0 degrees to represent the 0 degree point for the eight-phase signal (assuming that the eight-phase signal continues on). However, the 0 degree point for the four-phase signal does not necessarily coincide with the 0 degree point for the eight-phase signal. Rather, the four-phase signal may start at some random, indeterministic phase, with respect to the eight-phase signal. The transition between corresponding "0 degree phase signals" of eight-phase signal and the four-phase signal will be used to illustrate. The transition from waveform 644 to waveform 670 shows an indeterministic phase shift represented by double-arrow 680. The length of double-arrow 680 represents the phase shift, which is indeterministic. Likewise, the transition from waveform 648 to waveform 672 has an indeterministic phase shift represented by double-arrow 682. The indeterministic phase shifts will be discussed in more detail in below when FIGS. 6A and 6B are described in detail. Such indeterministic phase shifts can prevent switching between an eight-phase signal and a four-phase signal during, for example, a cellular phone call. This is because such indeterministic phase shifts may fail to comply with an industry standard for wireless communication.

One embodiment of an apparatus disclosed herein is able to transition between an eight-phase signal and a four-phase signal with a deterministic phase shift. For example, with reference to the double-arrow 680 in FIG. 6B, the amount of the phase shift is deterministic, in one embodiment. Also, the size of the phase shift is zero degrees, or close to zero degrees, in one embodiment. More generally, an embodiment of a circuit for shifting a frequency of a signal is able to transition between a $2^{(n-1)}$ phase signal and a $2^n$ phase signal (and vice versa) with a small, deterministic phase shift between the $2^{(n-1)}$ phase signal and the $2^n$ phase signal. In one embodiment, the transition between a $2^{(n-1)}$ phase signal and a $2^n$ phase signal is achieved with a 0 degree phase shift. The apparatus may transition between providing a $2^n$ phase signal and a $2^{(n-1)}$ phase signal to a frequency mixer during, for example, a cellular phone call. This can allow power to be saved when the eight-phase signal is not needed to reduce distortion.

In some devices, the circuitry that generates a $2^n$ phase signal and an $2^{(n-1)}$ phase signal does so based on a clock signal provided from a phase-locked loop (PLL). Switching between generating a $2^n$ phase signal and generating a $2^{(n-1)}$ phase signal can change the load on the PLL. The change in the load on the PLL can disturb the clock signal, which can prevent switching between a $2^n$ phase signal and an $2^{(n-1)}$ phase signal during, for example, a cellular phone call.

An embodiment of apparatus is able to transition between generating a four-phase signal and an eight-phase signal without changing the load on a PLL in a clock generator. Hence, the transition between generating a four-phase signal and an eight-phase signal can be made without disturbing a PLL. Therefore, the transition can be made without a need for a long settling time for a clock signal to stabilize. More generally, an embodiment of an apparatus is able to transition between generating a $2^{(n-1)}$ phase signal and generating a $2^n$ phase signal without changing the load on a PLL in a clock generator. Thus, the apparatus is able to transition between generating a $2^{(n-1)}$ phase signal and generating a $2^n$ phase signal during, for example, cellular phone call.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
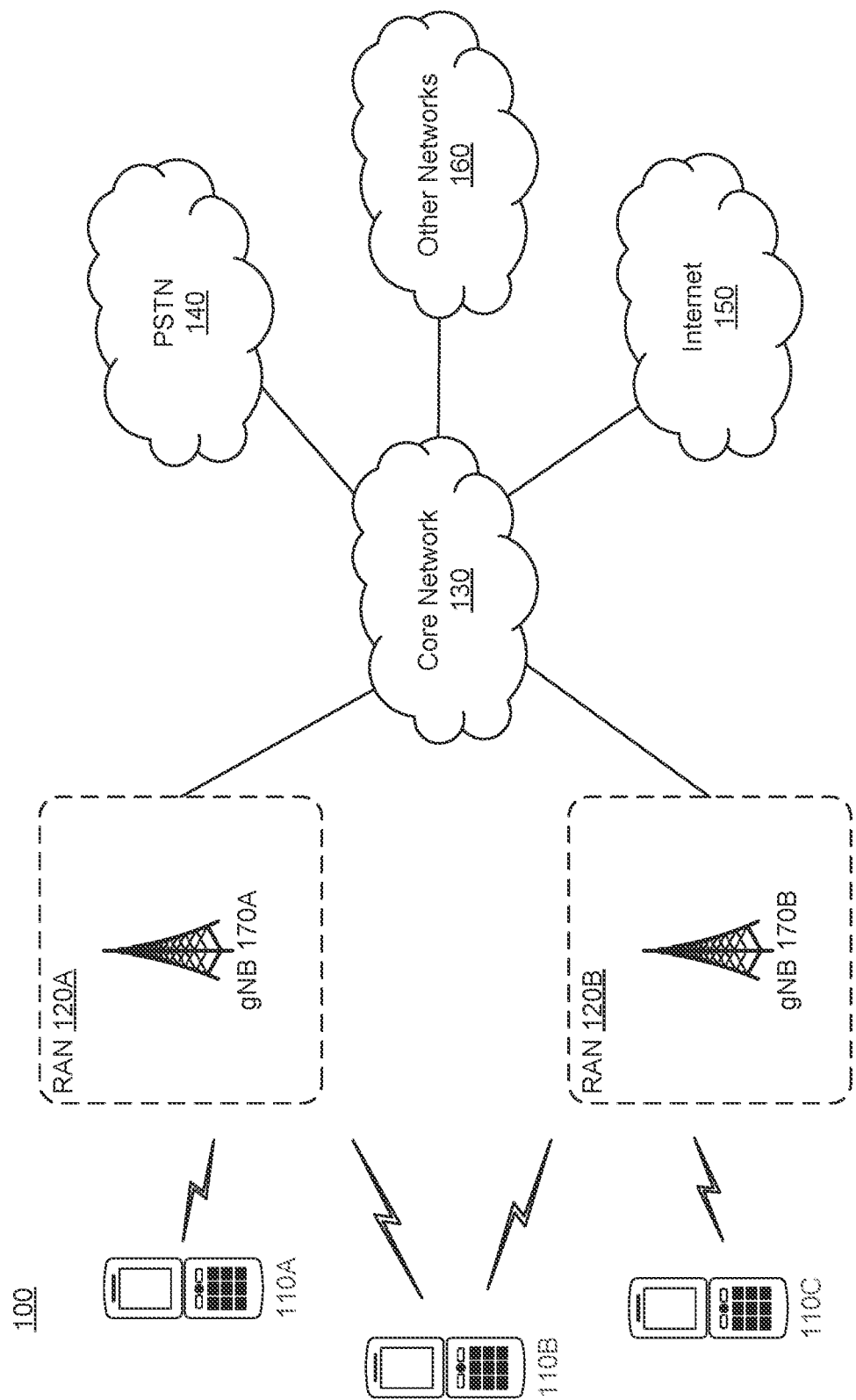
FIG. 1 illustrates a wireless network for communicating data.

FIG. 1 illustrates a wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g., 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A, 110B, and 110C, which can be referred to individually as a UE 110, or collectively as the UEs 110, are configured to operate and/or communicate in the system 100. For example, a UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

Figure 2:
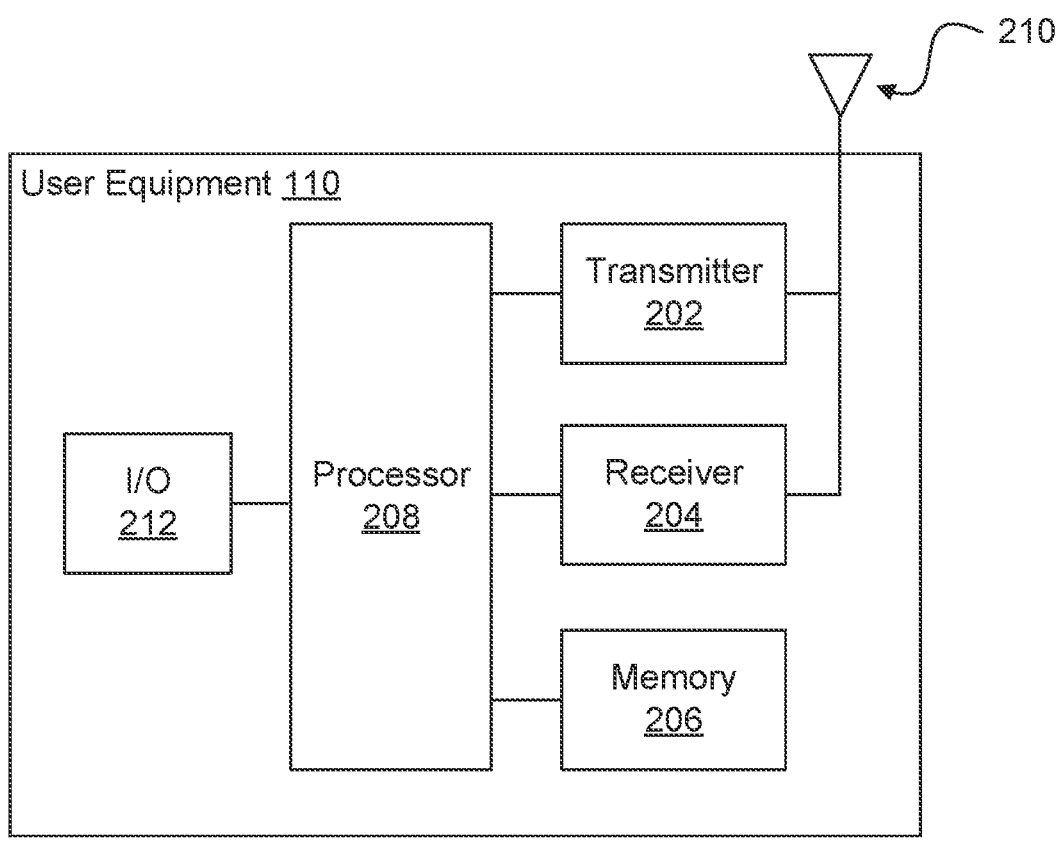
FIG. 2 illustrates example details of user equipment (UE) that may implement the methods and teachings according to this disclosure.

FIG. 2 illustrates example details of a UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 is an RF signal receiver, in some embodiments. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 208 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

Figure 3:
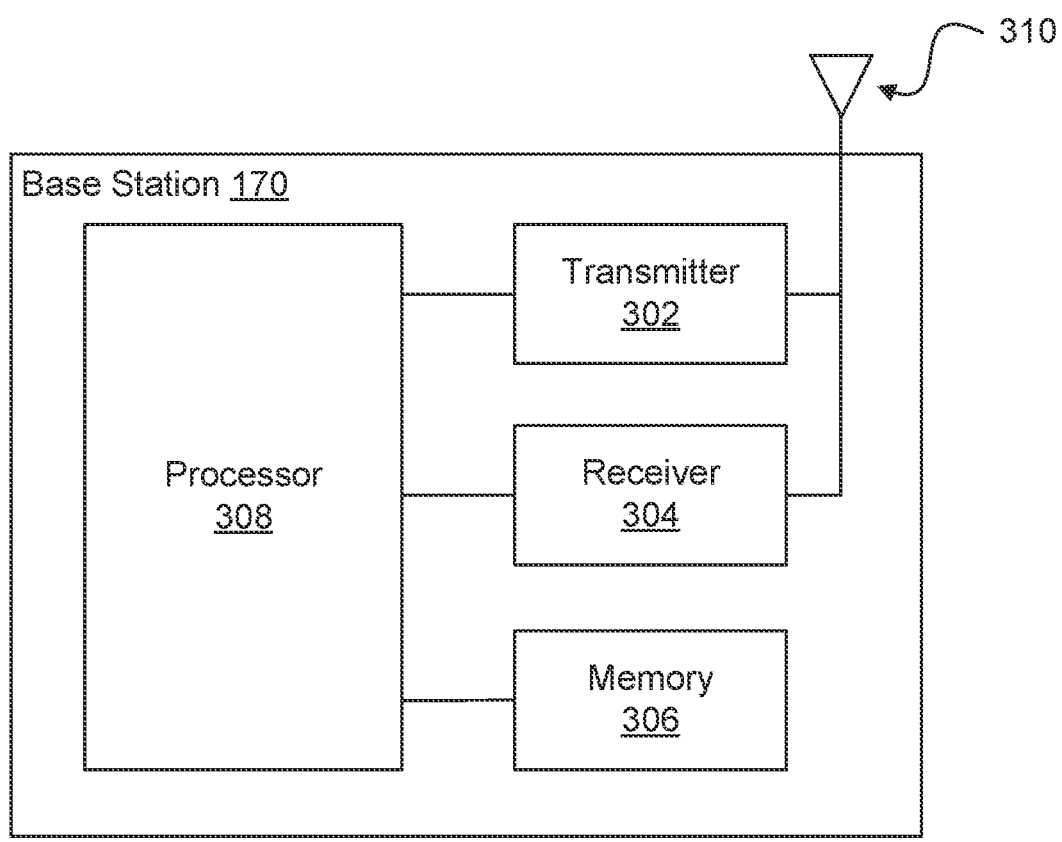
FIG. 3 illustrates an example base station (BS) that may implement the methods and teachings according to this disclosure.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

Figure 4:
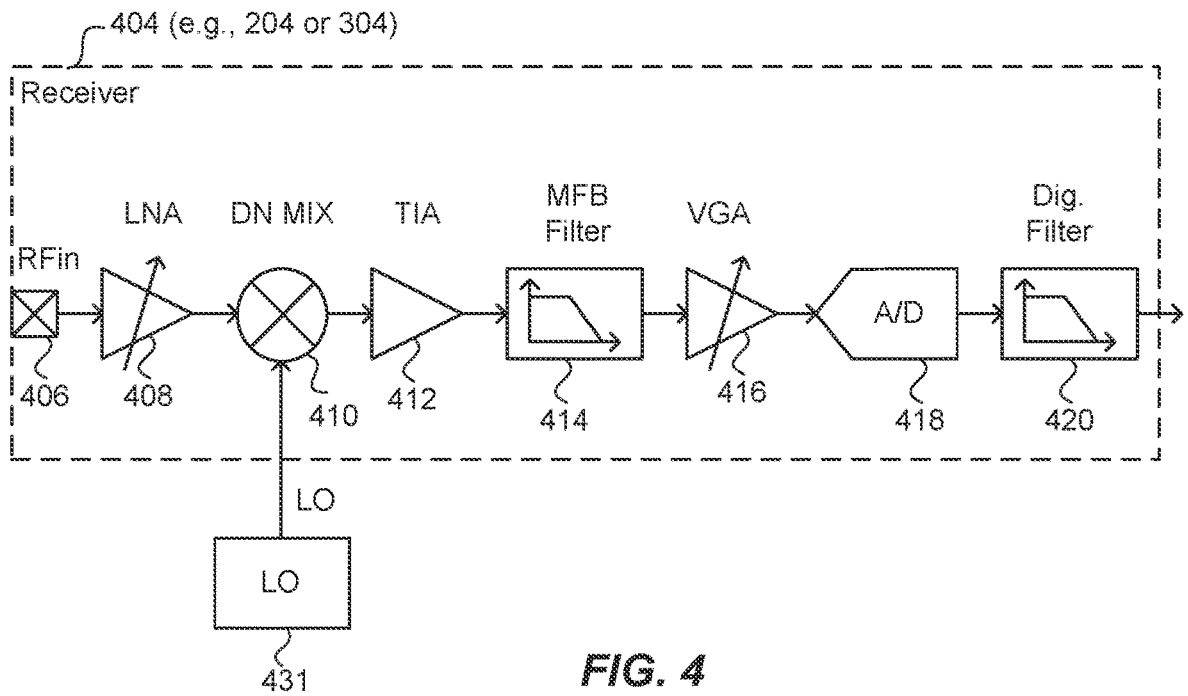
FIG. 4 illustrates a block diagram of one embodiment of a direct conversion receiver (DCR).

FIG. 4 illustrates a block diagram of one embodiment of a direct conversion receiver (DCR) 404, which can be the receiver 204 included in the UE 110 (shown in FIG. 2) or the receiver 304 included in the BS 170 (shown in FIG. 3), but is not limited thereto. The DCR 404 may also be referred to as a homodyne receiver or a zero-IF (Intermediate Frequency) receiver. The DCR 404 demodulates an incoming radio frequency (RF) signal using synchronous detection driven by a local oscillator (LO) 431. The frequency of the local oscillator 431 may be very close to or equal to the carrier frequency of the desired signal. The DCR 404 may also be referred to as an RF signal receiver.

Referring to FIG. 4, the receiver 404 is shown as including an input 406 at which is received as a radio frequency (RF) signal, and thus, the input 406 can also be referred to as the RF input 406. The RF input 406 can be coupled to an antenna or a coupler, but is not limited thereto. The RF signal received by the RF input 406 is provided to a low noise amplifier (LNA) 408, which may have an adjustable gain. The LNA 408 amplifies the relatively low-power RF signal it receives without significantly degrading the signal's signal-to-noise ratio (SNR).

The amplified RF signal that is output by the LNA 408 is provided to a frequency mixer 410. The frequency mixer 410 may input signals at two frequencies $f_1$, $f_2$, and mix them to create two new signals, one at the sum $f_1+f_2$, and the other at the difference $f_1-f_2$. Typically, only one of these new signals is used. The frequency mixer 410 receives the amplifier RF signal from the LNA 408, and an oscillator signal (LO) from a local oscillator, as the two input signals. Thus, the frequency mixer 410 may create a new signal from the amplifier RF signal and the oscillator signal. The frequency mixer 410 may shift (e.g., decrease) a frequency of the amplifier RF signal by a frequency of the oscillator signal to create the new signal. The amplifier RF signal may occupy a frequency range, in which case the frequency mixer 410 may shift the frequency range of the amplifier RF signal by a frequency of the oscillator signal. The frequency mixer 410 in FIG. 4 is a down-mixer (DN MIX) that frequency down-converts the amplified RF signal from a relatively high frequency to a baseband frequency, in one embodiment.

Still referring to FIG. 4, the frequency down-converted signal that is output from the mixer 410 is shown as being provided to a trans-impedance amplifier (TIA) 412. The TIA 412 acts as a current buffer to isolate a multi-feedback (MFB) filter 414 that is downstream of the TIA 412, from the mixer 410 that is upstream of the TIA 412. The MBF filter 414 low pass filters the frequency down-converted signal, to filter out high frequency signal components that are not of interest, such as HF noise. The filtered down-converted signal that is output from the MBF filter 414 is provided to a variable gain amplifier (VGA) 416, which is used to amplify the down-converted signal before it provided to an analog-to-digital converter (A/D) 418, which converts the down-converted signal from an analog signal to a digital signal. The digital signal output from the A/D 418 is then provided to a digital filter 420, which performs additional filtering to remove out of band signal components and attenuates quantization energy from the A/D 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

The local oscillator 431 may include a voltage-controlled oscillator (VCO), a digital controlled oscillator (DCO), or other circuit that provides the LO signal. In one embodiment, the local oscillator 431 includes a phase-locked loop (PLL), which contains a VCO. The LO signal is provided to the mixer 410 for use in the down-conversion process. Although shown as outside of receiver 404, depending on the embodiment, the local oscillator 431 can be formed on the same integrated circuit as one or more of the other elements in FIG. 4.

In some embodiments, the local oscillator 431 is able to switch between providing a $2^n$ phase oscillator signal and a $2^{(n-1)}$ phase oscillator signal (and vice versa) to the frequency mixer 410. In some embodiments, the local oscillator 431 is able to switch between providing an eight-phase oscillator signal and a four-phase oscillator signal (and vice versa) to the frequency mixer 410. In one embodiment, the local oscillator 431 contains phase generator 942 of FIG. 9A. In one embodiment, the local oscillator 431 contains phase signal generation circuit 712 of FIG. 11A.

The receiver 204 in the UE 110 (shown in FIG. 2), as well as the receiver 304 included in the BS 170, are not limited to being direct conversion receivers. For example, receivers 204, 304 could be superheterodyne receivers that have a frequency mixer that changes the incoming radio signal to an intermediate frequency. After processing the intermediate frequency signal, the superheterodyne receiver may have a frequency mixer that down-converts the processed intermediate frequency signal to a baseband signal.

Figure 5:
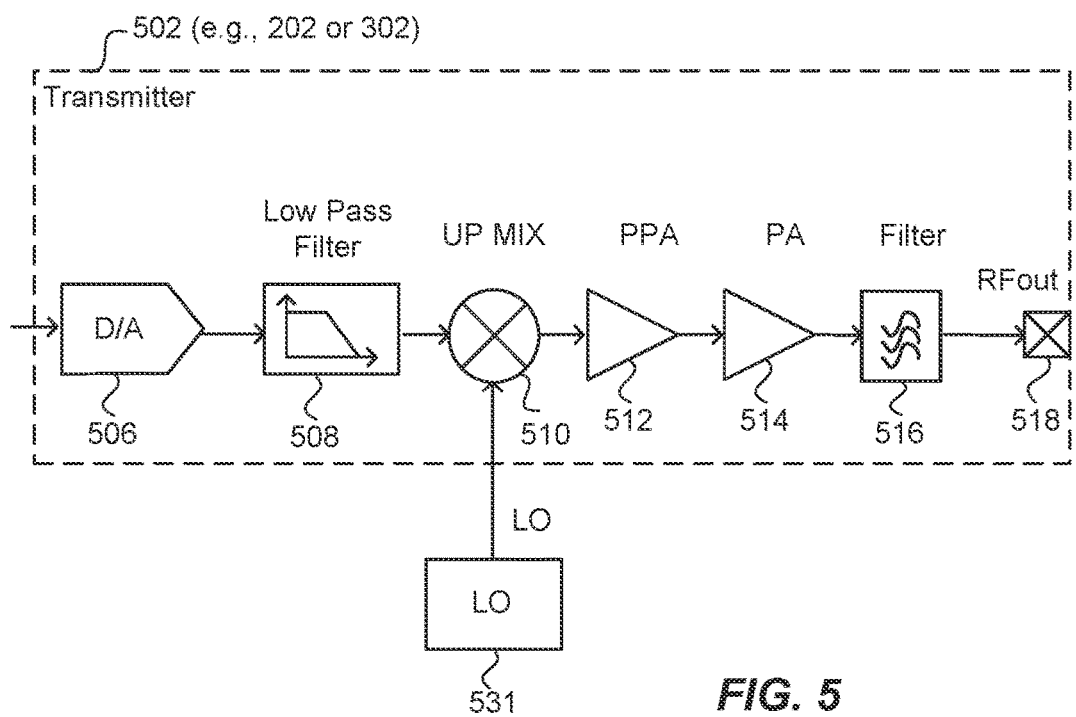
FIG. 5 illustrates details of one embodiment of a direct conversion transmitter.

FIG. 5 illustrates details of one example of a direct conversion transmitter 502, which can be the transmitter 202 included in the UE 110 (shown in FIG. 2) or the transmitter 302 included in the BS 170 (shown in FIG. 3), but is not limited thereto. The direct conversion transmitter 502 may also be referred to as a direct modulation transmitter. Referring to FIG. 5, the transmitter 502 is shown as including an output 518 at which is provided as a radio frequency (RF) signal, and thus, the output 518 can also be referred to as the RF output 518. The RF output 518 can be coupled to an antenna or a coupler, but is not limited thereto. The RF signal provided by the RF output 518 is provided from a power amplifier PA 514 though the bandpass or notch filter 516. The filter 516 can, for example, be a duplex/SAW filter and is used to remove unwanted frequency components above and below the desired RF frequency range from the amplified RF output signal generated by PA 514. The power amp PA 514 receives its input from a power pre-amplifier PPA 512, which initially receives the up-converted signal to be transmitted from the mixer 510.

Still referring to FIG. 5 the signal to be transmitted is received from the processor 208 of UE 110 of FIG. 2 or processor 308 of BS 170 of FIG. 3 at the digital to analog converter 506, with the digitized signal being filtered by low pass filter 508 to initially remove any high frequency noise before being up-converted at the frequency mixer 510.

Frequency mixer 510 may input signals at two frequencies $f_1$, $f_2$, and mix them to create two new signals, one at the sum $f_1+f_2$, and the other at the difference $f_1-f_2$. Typically, only one of these new signals is used. The analog version of the signal ("analog signal") is provided to frequency mixer 510, as one input signal. Frequency mixer 510 also receives oscillator signal LO from a local oscillator, as the other input signal. Thus, the frequency mixer 510 may create a new signal from the analog signal and the oscillator signal. The frequency mixer 510 may shift (e.g., increase) a frequency of the analog signal by a frequency of the oscillator signal to create the new signal. In one embodiment, the analog signal is a baseband signal. The oscillator signal is used as a carrier wave, in one embodiment. In one embodiment, the frequency mixer 510 modulates the oscillator signal (e.g., carrier wave) with the baseband signal to generate a radio frequency (RF) signal.

The analog signal may occupy a frequency range, in which case the frequency mixer 510 may shift the frequency range of the analog signal by a frequency of the oscillator signal. The frequency mixer 510 in FIG. 5 is an up-mixer (UP MIX) that frequency up-converts the analog signal. In one embodiment, the frequency mixer 510 is an up-mixer (UP MIX) that frequency up-converts the analog signal to an RF signal.

The local oscillator LO signal in FIG. 5 can be provided by a local oscillator 531. The local oscillator 531 may contain a VCO, DCO, or other circuit that provides the LO signal. The local oscillator 531 includes a PLL that contains a VCO, in one embodiment. The LO signal is provided to the frequency mixer 510 for use in the up-conversion process. Although shown as outside of transmitter 502, depending on the embodiment, the local oscillator 531 can be formed on the same integrated circuit as one or more of the other elements in FIG. 5.

In some embodiments, the local oscillator 531 is able to switch between providing a $2^n$ phase oscillator signal and a $2^{(n-1)}$ phase oscillator signal (and vice versa) to the frequency mixer 510. In some embodiments, the local oscillator 531 is able to switch between providing an eight-phase oscillator signal and a four-phase oscillator signal (and vice versa) to the frequency mixer 510. In one embodiment, the local oscillator 531 contains phase generator 942 of FIG. 9A. In one embodiment, the local oscillator 531 contains phase signal generation circuit 712 of FIG. 11A.

The transmitter 202 in the UE 110 (shown in FIG. 2), as well as the transmitter 302 included in the BS 170, are not limited to being direct conversion transmitters. For example, receivers 204, 304 could be superheterodyne transmitters that have a frequency mixer that shifts the analog signal to an intermediate frequency signal. The frequency mixer modulates an oscillator signal with the analog signal to generate the intermediate frequency signal, in one embodiment. After processing the intermediate frequency signal, the superheterodyne transmitter may have a frequency mixer that up-converts the processed intermediate frequency signal to a radio frequency signal.

FIG. 6A is a diagram of a circuit 600 for shifting a frequency of a signal. The circuit 600 may be used in receiver 404, in which case the circuit 600 may down-shift the frequency of the signal. The circuit 600 may be used in transmitter 502, in which case the circuit 600 may up-shift the frequency of the signal. As will be discussed below, there may be some technical problems with circuit 600. Embodiments disclosed herein provide technical solutions to such technical problems.

The clock generator 602 may be any circuit that is capable of generating a clock signal. The clock generator 602 may include a phase-locked loop (PLL) and a voltage-controlled oscillator (VCO), for example. The clock generator 602 provides the clock signal to both the 4-phase local oscillator signal generator 631a and the 8-phase local oscillator signal generator 631b. However, typically, the clock signal is only provided to one oscillator signal generator at a time.

Path 618 depicts a path for providing the clock signal from the clock generator 602 to the 4-phase local oscillator signal generator 631a. To provide the clock signal to the 4-phase local oscillator signal generator 631a, switches 610 and 614 are closed, whereas switches 612 and 616 are open. Thus, the clock signal is provided from the clock generator 602 through divider 604, and through inverter 608 to the 4-phase local oscillator signal generator 631a. Divider 604 may be a frequency divider, which may be used to divide a frequency of the clock signal prior to providing the clock signal to the 4-phase local oscillator signal generator 631a.

Path 620 depicts a path for providing the clock signal from the clock generator 602 to the 8-phase local oscillator signal generator 631b. To provide the clock signal to the 8-phase local oscillator signal generator 631b, switches 610 and 614 are open, whereas switches 612 and 616 are closed. Thus, the clock signal is provided from the clock generator 602 through inverter 606, and through inverter 608, to the 8-phase local oscillator signal generator 631b.

The circuit 600 has a 4-phase frequency mixer 610a and an 8-phase frequency mixer 610a, only one of which is typically used at a time to generate an output signal (Vsig_out). Either the 4-phase frequency mixer 610a or the 8-phase frequency mixer 610b is used to generate Vsig_out, based on Vsig_in and a local oscillator signal. The 4-phase frequency mixer 610a inputs a four-phase local oscillator signal (LO 4ϕ) from a 4-phase local oscillator signal generator 631a, and outputs a frequency shifted version of the input signal (Visg_in) based on the frequency of LO ϕ.

The 8-phase frequency mixer 610b inputs an eight-phase local oscillator signal (LO 8ϕ) from an 8-phase local oscillator signal generator 631b, and outputs a frequency shifted version of the input signal (Visg_in) based on the frequency of LO 8ϕ. An example of two cycles of an eight-phase local oscillator signal is depicted in FIG. 6B. The eight-phase local oscillator signal includes eight waveforms 644, 646, 648, 650, 652, 654, 656, and 658. Each waveform 644, 646, 648, 650, 652, 654, 656, and 658 may be provided to a different input of the 8-phase frequency mixer 610a.

The eight waveforms 644-656 each correspond to one phase of the eight-phase local oscillator signal. The degree associated with each phase is labeled next to the waveform. Specifically, waveform 644 corresponds to 0 degrees; waveform 646 corresponds to 45 degrees; waveform 648 corresponds to 90 degrees; waveform 650 corresponds to 135 degrees; waveform 652 corresponds to 180 degrees; waveform 654 corresponds to 225 degrees; waveform 656 corresponds to 270 degrees; and waveform 658 corresponds to 315 degrees.

Only two cycles of the eight-phase local oscillator signal are depicted in FIG. 6B to help depict indeterministic results that can occur when transitioning from the eight-phase local oscillator signal to the four-phase local oscillator signal. Five vertical dashed lines are labeled with 0°. Two of these lines indicate where waveform 644 (which corresponds to 0 degrees for the eight-phase local oscillator signal) transitions from low to high. The last three lines indicate where waveform 644 would have transitioned from low to high if waveform 644 had continued. Thus, the five vertical dashed lines labeled with 0° are each separated by one period of the eight-phase local oscillator signal.

An example of two cycles of a four-phase local oscillator signal is also depicted in FIG. 6B. The four-phase local oscillator signal includes four waveforms 670, 672, 674, and 676. Each waveform 670, 672, 674, and 676 may be provided to a different input of the 4-phase frequency mixer 610a. The four waveforms 670-676 each correspond to one phase of the four-phase local oscillator signal. The degree associated with each phase is labeled next to the waveform. Specifically, waveform 670 corresponds to 0 degrees; waveform 672 corresponds to 90 degrees; waveform 674 corresponds to 180 degrees; and waveform 676 corresponds to 270 degrees.

The transition from the eight-phase local oscillator signal to the four-phase local oscillator signal is represented by the stopping of the eight-phase local oscillator signal and the starting of the four-phase local oscillator signal. Note that the waveform 670 (which corresponds to 0 degrees for the four-phase local oscillator signal) does not transition from low to high at the 0 degree point of the eight-phase local oscillator signal. The double headed arrow labeled 680 indicates an indeterministic phase shift when transitioning from the eight-phase local oscillator signal to the four-phase local oscillator signal. The length of this indeterministic phase shift is random, such that the point at which waveform 670 transitions from low to high (relative to the vertical lines labeled 0°) cannot be reliably predicted. Other waveforms 672, 674, 676 also have an indeterministic phase shift as a result of the transition from the eight-phase oscillator signal to the four-phase oscillator signal. For example, waveform 672 should transition from low to high at degrees from the 0° dashed vertical lines, but exhibits a similar indeterministic phase shift as represented by double headed arrow 682.

A similar indeterministic phase shift occurs when transitioning from the four-phase local oscillator signal to the eight-phase local oscillator signal, although this transition is not depicted in FIG. 6B.

Thus, when switching between using the 4-phase frequency mixer 610a and the 8-phase frequency mixer 610b, there will also be a switch between using the 4-phase local oscillator signal generator 631a and the 8-phase local oscillator signal generator 631b. This switch between using the oscillator signal generators 631a, 631b may result in an indeterministic change in the phase between the two local oscillator signals (LO 4ϕ, LO 8ϕ). This indeterministic change in the phase of the local oscillator signals may be problematic. For example, such an indeterministic change in the phase of the local oscillator signals may fail to comply with requirements of an industry standard for providing wireless communication. This may limit when the transition is permitted to be made. In some cases, the transition cannot be made during a cellular phone call.

Another problem with circuit 600 is that loading on the clock generator 602 may change when switching between providing the clock signal on path 618 and path 620. In this example, the divider 604 provides a load on the clock generator 602 when path 618 is selected, whereas inverter 606 provides a load on the clock generator 602 when path 620 is selected. The change in load may disturb a PLL, or other circuitry, in the clock generator 602. Such a disturbance may cause the clock signal to be disturbed. It may take a significant amount of time (in terms of clock cycles) for the clock to settle following such a disturbance. Thus, the operation of the frequency mixers 610a and/or 610b may be compromised when switching between paths 618 and 620.

Figure 7:
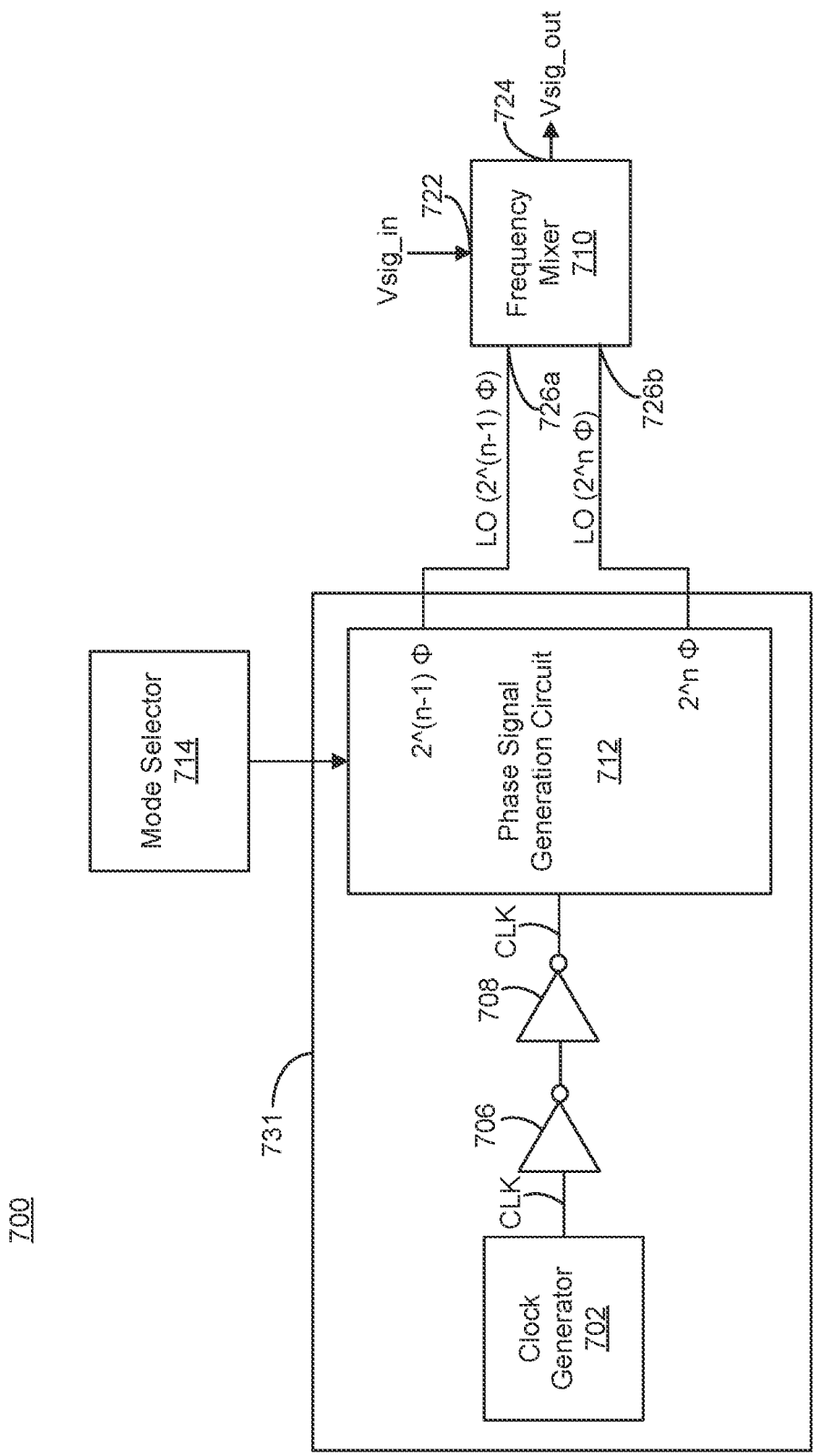
FIG. 7 is a diagram of one embodiment of an apparatus for shifting a frequency of a signal.

FIG. 7 is a diagram of one embodiment of an apparatus 700 for shifting a frequency of a signal. The apparatus 700 is included in a radio receiver, in one embodiment. The apparatus 700 may be included in radio receiver 204 or 304, but is not limited to those radio receivers. The apparatus 700 may be included in a direct conversion receiver (e.g., DCR 404), or a superheterordyne receiver, but is not limited thereto. The apparatus 700 is included in radio transmitter, in one embodiment. The apparatus 700 may be used in radio transmitter 202 or 302, but is not limited to those radio transmitters. The phase generator 942 may be included in a direct conversion transmitter (e.g., transmitter 502), or a superheterordyne transmitter, but is not limited thereto.

The apparatus 700 includes a frequency generator 731, a frequency mixer 710, and a mode selector 714. The frequency generator 731 is configured to generate either a $2^{(n-1)}$ phase oscillator signal (LO ($2^{(n-1)}\phi$)) or a $2^n$ phase oscillator signal (LO ($2^n\phi$)), where "n" is an integer greater than 1. In one embodiment, the $2^{(n-1)}$ phase oscillator signal is a 4-phase oscillator signal and the $2^n$ phase oscillator signal is an 8-phase oscillator signal. The mode selector 714 may be used to select between the $2^{(n-1)}$ phase oscillator signal and the $2^n$ phase oscillator signal. Thus, the apparatus 700 may transition between the $2^{(n-1)}$ phase oscillator signal and the $2^n$ phase oscillator signal. The frequency generator 731 is used to implement local oscillator 431, in one embodiment. The frequency generator 731 is used to implement local oscillator 531, in one embodiment. The multi-phase signals that are generated by the frequency generator 731 may be referred to as "multi-phase oscillator signals" (or "multi-phase local oscillator signals") when they are provided to a frequency mixer. However, the multi-phase signals are not required to be provided to a frequency mixer, as many other types of electronic circuits can utilize such multi-phase signals.

The frequency mixer 710 has a signal input 722 that receives an input signal (Vsig_in). The frequency mixer 710 is configured to output, at a signal output 724, a frequency range shifted version of the input signal based on a frequency of an oscillator signal received at an oscillator input of the frequency mixer. As depicted in FIG. 7, LO ($2^{(n-1)}\phi$) is received at oscillator input 726a. As depicted in FIG. 7, LO ($2^n\phi$) is received at oscillator input 726b. Physically, there may be overlap between oscillator input 726a and oscillator input 726b. For example, the various phase signals of LO ($2^{(n-1)}\phi$) may be provided to the same nodes in the frequency mixer 710 as at least some of the phase signals of LO ($2^n\phi$).

The input signal (Vsig_in) is a radio frequency (RF) signal, which is down-converted by the frequency mixer 710, in one embodiment. The RF signal is down-converted to a baseband signal, in one embodiment. The baseband signal may be output on the signal output 724, wherein the signal output 724 may be referred to as a baseband signal output. The RF signal is down-converted to an intermediate frequency signal, in one embodiment. The input signal (Vsig_in) is a baseband signal, which is up-converted to an RF signal, in one embodiment. The input signal (Vsig_in) is an intermediate frequency signal, which is up-converted to a RF signal, in one embodiment. In one embodiment, the frequency mixer 710 modulates a carrier wave (e.g., oscillator signal) with the input signal.

The frequency generator 731 includes a clock generator 702, a first buffer 706, a second buffer 708, and a phase signal generation circuit 712, in one embodiment. The clock generator 702 may be any circuit that is capable of generating a clock signal. In one embodiment, the clock generator 702 includes a phase-locked loop (PLL). The PLL contains a voltage-controlled oscillator (VCO), in one embodiment.

The PLL contains a digital controlled oscillator (DCO), in one embodiment. The clock generator 702 is not required to contain a PLL.

The first buffer 706 and the second buffer 708 are inverting buffers (or inverters), in the embodiment depicted in FIG. 7. However, non-inverting buffers may also be used for the first and second buffers 706, 708. Also, the number of buffers may vary, depending on implementation. In one embodiment, a single buffer is used instead of the first buffer 706 and the second buffer 708. The first buffer 706 and the second buffer 708 each have unity gain, in one embodiment. The first buffer 706 and the second buffer 708 are voltage buffers, in one embodiment. The first buffer 706 and the second buffer 708 are current buffers, in one embodiment.

The clock signal (CLK) is provided from the clock generator 702 to the phase signal generation circuit 712 after passing through the first buffer 706 and the second buffer 708. The phase signal generation circuit 712 is depicted with a first output labeled "$2^{(n-1)}\phi$" and a second output labeled "$2^n\phi$." The $2^{(n-1)}\phi$ output provides the $2^{(n-1)}\phi$ phase oscillator signal to the frequency mixer 710. The $2^n)\phi$ output provides the $2^n\phi$ phase oscillator signal to the frequency mixer 710.

In one embodiment, the $2^n\phi$ phase oscillator signal comprises $2^n$ phase signals, each of which is a different phase of the $2^n\phi$ phase oscillator signal. Each of the $2^n$ phase signals is provided to the frequency mixer 710 as a differential signal, in one embodiment. Thus, a given differential phase signal is provided to, for example, the gates of two transistors in the frequency mixer 710, in one embodiment. Therefore, the $2^n\phi$ phase oscillator signal is provided across $2*2^n$ electrical lines, in one embodiment. The $2^{(n-1)}\phi$ phase oscillator signal is provided to the frequency mixer 710 over a subset of the $2*2^n$ electrical lines, in one embodiment. For example, the $2^{(n-1)}\phi$ phase signal may be provided to the frequency mixer 710 over half of the $2*2^n$ electrical lines.

An embodiment of apparatus 700 is able to transition between an eight-phase oscillator signal and a four-phase oscillator signal (and vice versa) with a deterministic phase shift. In one embodiment, when transitioning from an eight-phase oscillator signal to a four-phase oscillator signal, the 0 degree waveform (also referred to as the 0 degree phase signal) of the four-phase oscillator signal transitions from low to high at a point in time at which the 0 degree waveform of the eight-phase oscillator signal would have transitioned from low to high, if the eight-phase oscillator signal had continued. In one embodiment, when transitioning from a four-phase oscillator signal to an eight-phase oscillator signal, the 0 degree waveform of the eight-phase oscillator signal transitions from low to high at a point in time at which the 0 degree waveform of the four-phase oscillator signal would have transitioned from low to high, if the four-phase oscillator signal had continued. More generally, an embodiment of circuit for shifting a frequency of a signal disclosed herein is able to transition between generating a $2^{(n-1)}$ phase oscillator signal and generating a $2^n$ phase oscillator signal with a deterministic phase shift between the $2^{(n-1)}$ phase oscillator signal and the $2^n$ phase oscillator signal. FIGS. 11B and 11C depict examples of such transitions. FIGS. 11B and 11C will be discussed below.

An embodiment of apparatus 700 is able to transition between generating a four-phase oscillator signal and an eight-phase oscillator signal without changing the load on a PLL in a clock generator. Hence, the transition between generating a four-phase oscillator signal and an eight-phase oscillator signal (and vice versa) can be made without disturbing a PLL. Therefore, the transition can be made without a need for a long settling time for a clock signal to stabilize. In one embodiment, the buffer 706 provides the same load on the clock generator 702 in the eight-phase mode and in the four-phase, which helps the PLL to settle faster when a transition between the eight-phase mode and four-phase mode (or vice versa) occurs. Stated another way, the clock (CLK) is provided to the phase signal generation circuit 712 along the same electrical path in both the eight-phase mode and in the four-phase mode in order to maintain the same load on the clock generator 702 in both the eight-phase mode and in the four-phase mode. This differs from the circuit of FIG. 6A in which divider 604 is connected to the clock generator 602 when path 618 is taken to provide the clock signal to the 4-Phase Local Oscillator Signal Generator 631a, and in which the inverter 606 is connected to the clock generator 602 when path 620 is taken to provide the clock signal to the 8-Phase Local Oscillator Signal Generator 631b. More generally, an embodiment of a circuit for shifting a frequency of a signal disclosed herein is able to transition between generating a $2^n$ phase oscillator signal and a $2^{(n-1)}$ phase oscillator signal (and vice versa) without changing the load on a PLL in a clock generator.

Figure 9A:
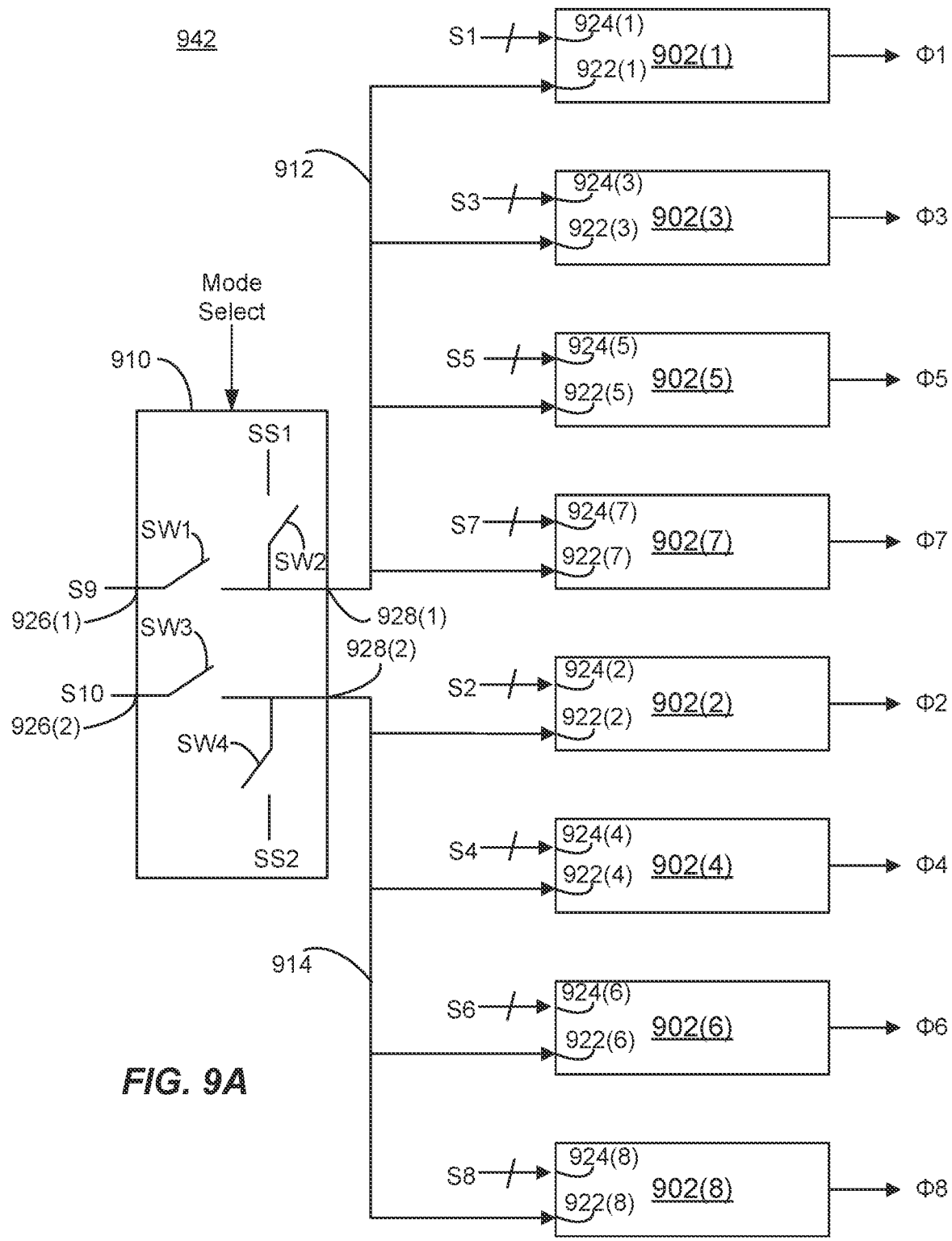
FIG. 9A is a diagram of one embodiment of a phase generator that may be used in the apparatus of FIG. 7.

FIG. 9A is a diagram of one embodiment of a phase generator 942. The phase generator 942 of FIG. 9A may be used in the phase signal generation circuit 712 of FIG. 7. The phase generator 942 may be used to generate an 8-phase signal or a 4-phase signal, each of which is a multi-phase signal. The 8-phase signal is one example of a $2^n$ phase signal, and the 4-phase signal is one example of a $2^{(n-1)}$ phase signal. Either multi-phase signal may be provided to a frequency mixer. Thus, the multi-phase signals may also be referred as a $2^n$ phase local oscillator signal and a $2^{(n-1)}$ phase local oscillator signal.

The phase generator 942 is included in a radio receiver, in one embodiment. The phase generator 942 may be included in radio receiver 204 or 304, but is not limited to those radio receivers. The phase generator 942 may be included in a direct conversion receiver (e.g., DCR 404), or a superheterodyne receiver, but is not limited thereto. The phase generator 942 is included in radio transmitter, in one embodiment. The phase generator 942 may be used in radio transmitter 202 or 302, but is not limited to those radio transmitters. The phase generator 942 may be included in a direct conversion transmitter (e.g., transmitter 502), or a superheterordyne transmitter, but is not limited thereto.

The phase generator 942 has a number of phase signal generation stages 902(1)-902(8). Reference number 902 will be used when discussing one or more of the phase signal generation stages without reference to a specific phase signal generation stages. The phase signal generation stages 902 may be referred to more succinctly as "stages." Each stage 902 is configured to generate one phase signal of a multi-phase signal based on its inputs. When in an 8-phase mode, the stages 902 may collectively generate waveforms 804-818 of FIG. 8. When in a 4-phase mode, four of the stages 902 may collectively generate waveforms 820, 822, 824, 826 of FIG. 8.

Collectively, waveforms 804-818 are referred to as an eight-phase signal. In some embodiments, the eight-phase signal is used as an input to a frequency mixer, in which case waveforms 804-818 may be referred to as an eight-phase local oscillator signal. The eight waveforms 804-818 each correspond to one phase of the eight-phase signal. Hence, each waveform 804-818 may be referred to as one phase (or one phase signal) of the eight-phase signal. The phase may be specified by a degree, which indicates when the waveform transitions from low to high. Waveform 804 corresponds to degrees; waveform 806 corresponds to 45 degrees; waveform 808 corresponds to 90 degrees; waveform 810 corresponds to 135 degrees; waveform 812 corresponds to 180 degrees; waveform 814 corresponds to 225 degrees; waveform 816 corresponds to 270 degrees; and waveform 818 corresponds to 315 degrees.

The waveforms 804-818 are ordered in FIG. 8 in accordance with their phases. The waveforms 804-818 may be referred to herein as either odd phase signals or even phase signals, based on this order. In FIG. 8, waveforms 804, 808, 812, and 816 are referred to as "odd phase signals," whereas waveforms 806, 810, 814, and 818 are referred to as "even phase signals."

In the example of FIG. 8, each of the eight waveforms 804-818 is a binary periodic signal. In some embodiments, each phase of an eight-phase signal has the same duty cycle. In the example of FIG. 8, each of the eight waveforms 804-818 has a duty cycle of ⅛ or 12.5%, but that is not a requirement. In the example of FIG. 8, each of the eight waveforms 804-818 are non-overlapping, but that is not a requirement. By "non-overlapping" is it meant that there is no overlap between any of the eight waveforms 804-818. In one embodiment, each phase of an eight-phase signal has the same duty cycle, but there is some overlap between phases.

The following are details about which stages 902 may generate which waveforms in one embodiment of an 8-phase mode. The terms ɸ1-ɸ8 next to the waveforms 804-818 in FIG. 8 corresponds to which stage 902 generates the waveform, in one embodiment. Phase signal generation stage 902(1) may generate waveform 804; phase signal generation stage 902(2) may generate waveform 806; phase signal generation stage 902(3) may generate waveform 808; phase signal generation stage 902(4) may generate waveform 810; phase signal generation stage 902(5) may generate waveform 812; phase signal generation stage 902(6) may generate waveform 814; phase signal generation stage 902(7) may generate waveform 816; and phase signal generation stage 902(8) may generate waveform 818.

A stage 902 is referred to herein as being either an odd stage or an even stage based on the waveform it generates in the 2^n mode. Thus, stages 902(1), 902(3), 902(5) and 902(7) are defined herein as odd stages. Stages 902(2), 902(4), 902(6) and 902(6) are defined as even stages.

The following are details of waveforms that may be generated in one example of a 4-phase mode. Collectively, waveforms 820-826 are referred to as a four-phase signal. In the example of FIG. 4, each of the four waveforms 820-826 is a binary periodic signal. In some embodiment, the four-phase signal is used as an input to a frequency mixer, in which case waveforms 820-826 may be referred to as a four-phase local oscillator signal. The four waveforms 820-826 each correspond to one phase of the four-phase signal. The phase may be specified by a degree, which indicates when the waveform transitions from low to high. Waveform 820 corresponds to 0 degrees; waveform 822 corresponds to 90 degrees; waveform 824 corresponds to 180 degrees; and waveform 826 corresponds to 270 degrees.

In some embodiments, each phase of a four-phase signal has the same duty cycle. In the example of FIG. 8, each of the four waveforms 820-826 has a duty cycle that is ¼ or 25%, but that is not a requirement. In the example of FIG. 8, each of the four waveforms 820-826 are non-overlapping, but that is not a requirement. In one embodiment, each phase of a four-phase signal has the same duty cycle, but there is some overlap between phases.

The terms ɸ1, ɸ3, ɸ5, and ɸ7 next to the waveforms 820-826 in FIG. 8 corresponds to which stage 902 generates the waveform, in one embodiment. Phase signal generation stage 902(1) may generate waveform 820; phase signal generation stage 902(3) may generate waveform 822; phase signal generation stage 902(5) may generate waveform 824; and phase signal generation stage 902(7) may generate waveform 826.

In one embodiment of a 4-phase mode, phase signal generation stage 902(2), 902(4), 902(6), and 902(8) do not generate a phase signal of the four-phase signal. Thus, phase signal generation stage 902(2) may generate waveform 828; phase signal generation stage 902(4) may generate waveform 828; phase signal generation stage 902(6) may generate waveform 828; and phase signal generation stage 902(8) may generate waveform 828. Thus, in this example, the odd stages 902(1), 902(3), 902(5), and 902(7) may each be used to generate one phase signal of the four-phase oscillator signal.

More specifically, each stage 902 may generate one of the phase signals of a multi-phase signal based on signals at the inputs of the respective stage 902. Each stage 902 has a mode input 922. The mode input may be used to select whether that stage 902 is being operated in the eight-phase mode or in the four-phase mode. The reference numeral 922 will be used to refer to a mode input without reference to a specific stage 902. Each of the stages 902 has a fixed input 924, in one embodiment. The fixed input 924 is used to input one or more binary periodic signals, in one embodiment. The reference numeral 924 will be used to refer to a fixed input without reference to a specific stage 902. In some embodiments, the stages 902 contain logic gates (e.g., AND, NAND, NOR, etc.), which respond to one or more logic signals, each having a high value and a low value. A binary periodic signal may transition between a logic high value and a logic low value. FIG. 12 depicts several examples of binary periodic signals. The clock signal (CLK) 802 is one example of a binary periodic signal. Waveforms 1202-1216 in FIG. 12 are each an example of a binary periodic signal. The waveforms 1202-1216 will be discussed in more detail when describing an embodiment of FIG. 11A.

Referring again to FIG. 9A, in one embodiment of the phase generator 942, each of the stages 902 is provided with the same binary periodic signal at its fixed input 924 in both the four-phase mode and the eight-phase mode, which may help to provide for a deterministic relationship between the phase of the oscillator signal when transitioning between the four-phase mode and the eight-phase mode (and vice versa). In FIG. 9A, those signals are labeled S1-S8.

With reference to FIG. 9A, fixed input 924(1) of stage 902(1) receives signals S1 in both the four-phase mode and the eight-phase mode; fixed input 924(2) of stage 902(2) receives signals S2 in both the four-phase mode and the eight-phase mode; fixed input 924(3) of stage 902(3) receives signals S3 in both the four-phase mode and the eight-phase mode; fixed input 924(4) of stage 902(4) receives signals S4 in both the four-phase mode and the eight-phase mode; fixed input 924(5) of stage 902(5) receives signals S5 in both the four-phase mode and the eight-phase mode; fixed input 924(6) of stage 902(6) receives signals S6 in both the four-phase mode and the eight-phase mode; fixed input 924(7) of stage 902(7) receives signals S7 in both the four-phase mode and the eight-phase mode; and fixed input 924(8) of stage 902(8) receives signals S8 in both the four-phase mode and the eight-phase mode.

The phase generator 942 has a controller 910. The controller 910 may be used to control the stages 902 in order to select between the eight-phase mode and the four-phase mode. In one embodiment, the controller 910 receives a mode select signal, which instructs the controller 910 whether to operate the stages 902 in the four-phase mode or the eight-phase mode.

The controller 910 provides a first mode control signal 912 to the mode inputs 922(1), 922(3), 922(5), and 922(7) of the respective odd stages 902(1), 902(3), 902(5), and 902(7). The controller 910 provides a second mode control signal 914 to the mode inputs 922(2), 922(4), 922(6), and 922(8) of the respective even stages 902(2), 902(4), 902(6), and 902(8). In one embodiment, the first mode control signal 912 is a periodic binary signal to select the eight-phase mode, but is a steady state signal to select the four-phase mode. In one embodiment, the first mode control signal 912 is a first version of the clock signal 802 to select the eight-phase mode. In one embodiment, the second mode select signal 914 is a periodic binary signal to select the eight-phase mode, but is a steady state signal to select the four-phase mode. In one embodiment, the second mode select signal 914 is a second version of the clock signal 802 to select the eight-phase mode.

In one embodiment, the controller 910 receives a first periodic binary signal "S9" at a first input 926(1) and a second periodic binary signal "S10" at a second input 926(2). The controller 910 has a first output 928(1) that provides the first periodic binary signal to the mode inputs 922 of the odd stages 902(1), 902(3), 902(5), and 902(7) in response to the mode select signal instructing the eight-phase mode, in one embodiment. To pass the first periodic binary signal, the controller 910 may close switch SW1 and open switch SW2. The controller 910 has a second output 928(2) that provides the second periodic binary signal to the mode inputs 922 of the even stages 902(2), 902(4), 902(6), and 902(8) in response to the mode select signal instructing the eight-phase mode, in one embodiment. To pass the second periodic binary signal, the controller 910 may close switch SW3 and open switch SW4.

To operate the stages 902 in the four-phase mode, the controller 910 replaces the first and second periodic binary signals (S9, S10) with first and second steady state signals, in one embodiment. In embodiments in which a steady state signal is input into a logic gate in a stage 902, the steady state signal has either a logic high value or a logic low value, but does not transition between the logic high value and the logic low value. Hence, "steady state" means to remain at one state (e.g., logic high or logic low). The magnitude of the logic high value and the logic low value may depend on the logic gates in the stages 902. The magnitude of a steady state may vary over time, so long as it remains in the same state.

To pass the first steady state signal to the mode inputs 922 of the odd stages 902(1), 902(3), 902(5), and 902(7), the controller 910 may open switch SW1 and close switch SW2. Switch SW2 is connected to the first steady state signal ("SS1"). In one embodiment, the first steady state signal is a positive (non-zero) voltage such as Vdd. The odd stages 902(1), 902(3), 902(5), and 902(7) react to SS1 as a logic high signal, in one embodiment.

To pass the second steady state signal to the mode inputs 922 of the even stages 902(2), 902(4), 902(6), and 902(8), the controller 910 may open switch SW3 and close switch SW4. Switch SW4 is connected to the second steady state signal ("SS2"). In one embodiment, the second steady state signal is a lower voltage than the first steady state signal (e.g., Vss). The even stages 902(2), 902(4), 902(6), and 902(8) react to SS2 as a logic low signal, in one embodiment.

Figure 9B:
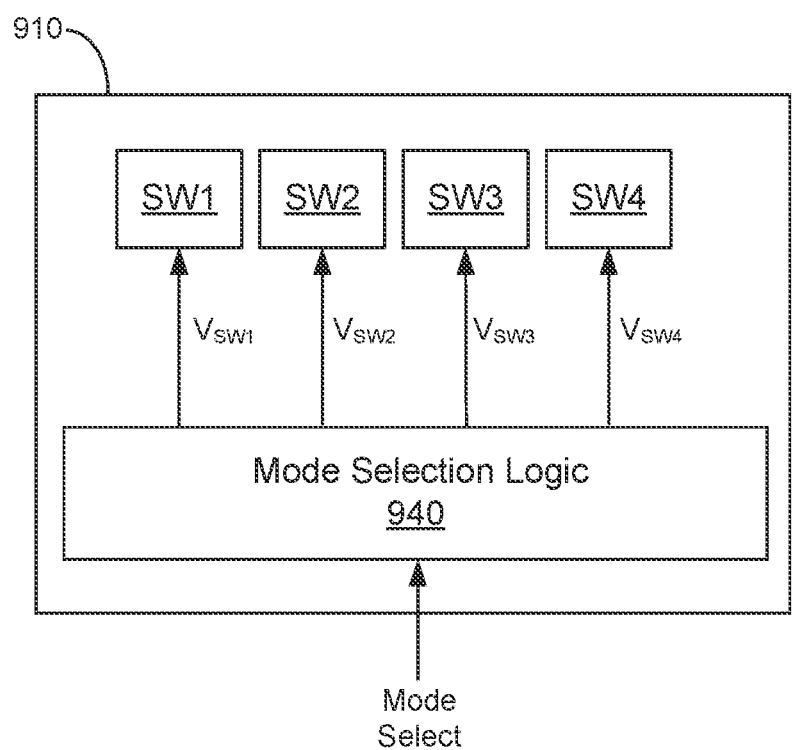
FIG. 9B depicts further details of one embodiment of a controller.

FIG. 9B depicts further details of one embodiment of the controller 910. The controller 910 includes mode selection logic 940 and switches SW1, SW3, SW2, and SW4. The mode selection logic 940 receives the mode select signal and generates signals (e.g., voltages) to control the switches SW1, SW2, SW3, and SW4. The mode select signal could be any analog or digital signal. In one embodiment, the mode select signal is a binary signal such that one logic value selects the $2^{(n-1)}$ phase mode and another logic value selects the $2^n$ phase mode. The mode selection logic 940 generates voltages $V_{SW1}$, $V_{SW2}$, $V_{SW3}$, and $V_{SW4}$ to control the respective switches. In one embodiment, each switch includes at least one transistor. The voltages $V_{SW1}$, $V_{SW2}$, $V_{SW3}$, and $V_{SW4}$ are applied to control terminals (e.g., gates) of the respective transistors to open/close the switches, in one embodiment. The mode selection logic 940 may operate as described with respect to the description of the controller 910 of FIG. 9A in order to control the switches to provide the mode select signals to the stages 902.

Some of the details of the controller 910 are omitted from FIG. 9B, so as to not obscure the diagram. For example, details of the connections of the switches SW1, SW2, SW3, and SW4 are not depicted in FIG. 9B. Likewise, the first periodic binary signal "S9", the second periodic binary signal "S10", first mode control signal 912, and the second mode control signal 914 are omitted from FIG. 9B, so as to not obscure the diagram. It will be understood that the connections and operation of the switches SW1, SW2, SW3, and SW4 shown and described with respect to FIG. 9A also apply to one embodiment of the controller 910 of FIG. 9B.

The mode selection logic 940 may be implemented using hardware, software, or a combination of both hardware and software. For example, mode selection logic 940 may be implemented with a Field-programmable Gate Array (FPGA), Application-specific Integrated Circuit (ASIC), Application-specific Standard Product (ASSP), System-on-a-chip system (SOC), Complex Programmable Logic Device (CPLD), special purpose computer, etc. In one embodiment, software (stored on a storage device) is used to program one or more processors to implement functions performed by the mode selection logic 940.

Figure 10:
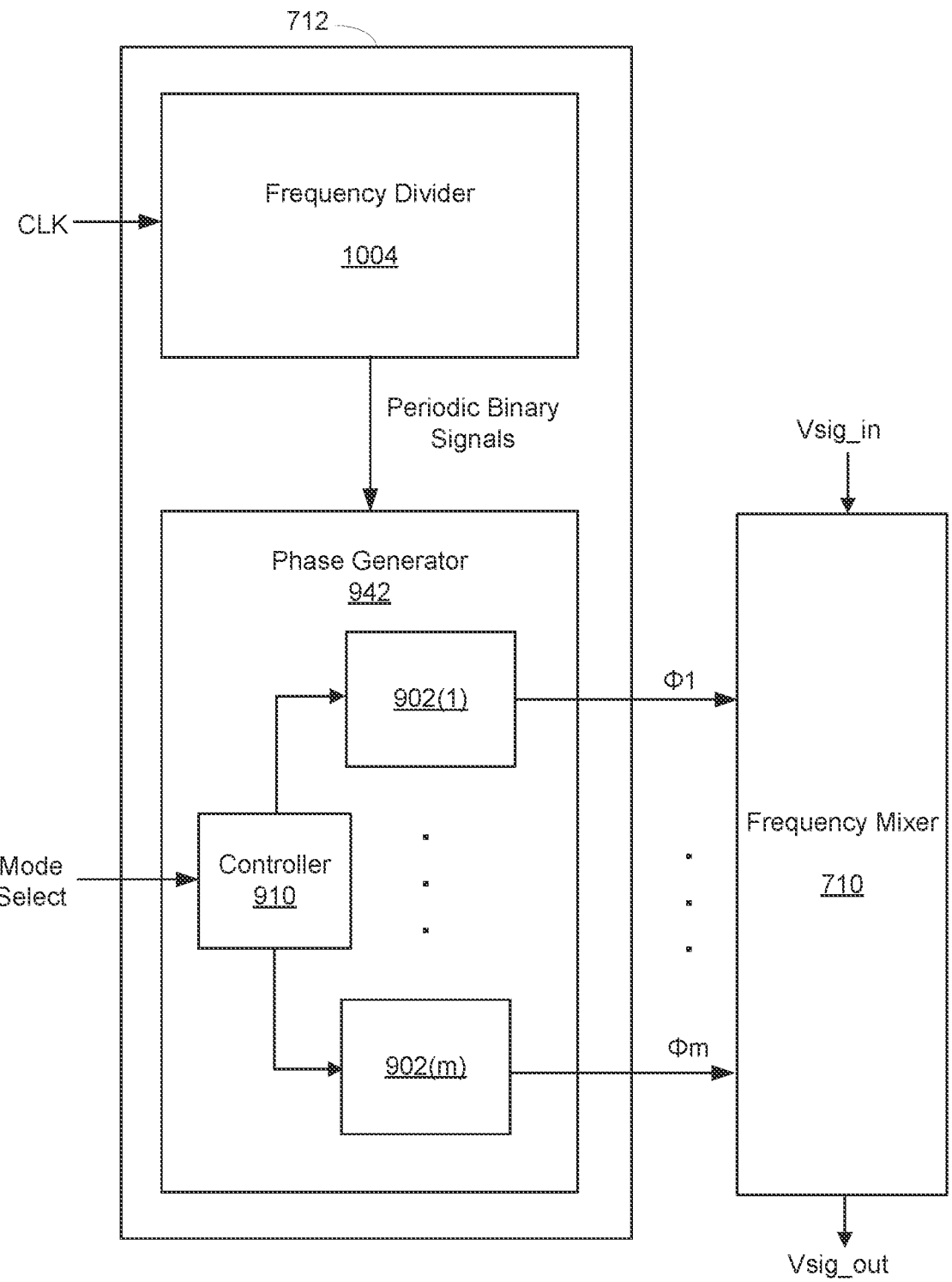
FIG. 10 is a diagram of one embodiment of a phase signal generation circuit that provides oscillator signals to a frequency mixer.

FIG. 10 is a diagram of one embodiment of a phase signal generation circuit 712 that provides oscillator signals to a frequency mixer 710. The phase signal generation circuit 712 depicted in FIG. 10 is one embodiment of phase signal generation circuit 712 depicted in FIG. 7. The phase signal generation circuit 712 depicted in FIG. includes a frequency divider 1004 and a phase generator 942.

The frequency divider 1004 inputs a clock signal (CLK) and generates periodic binary signals based on CLK. FIG. 12 shows one example of a clock signal (CLK) 802. FIG. 12 shows several examples of periodic binary signals 1202-1216, which one embodiment of the frequency divider 1004 generates based on the clock signal 802. In the example of FIG. 12, each of the periodic binary signals 1202-1216 has the same frequency, but they are shifted from each other in phase. Being "shifted from each other in phase" means that the low to high transitions occur at different times. For example, waveform 1202 may be considered to be zero degrees, waveform 1204 may be considered to be 45 degrees, etc. In this example, each periodic binary signal 1202-1216 has ¼ the frequency of the clock signal 802. The periodic binary signals 1202-1216 are not required to have ¼ the frequency of the clock signal 802.

With reference to FIG. 10, the frequency divider 1004 provides the periodic binary signals to the phase generator 942. The phase generator 942 includes a controller 910 and a number of phase signal generation stages 902(1)-902(m). The mode select signal is used to indicate whether the controller 910 should operate the stages 902 in a 2^(n−1) phase mode or a 2^n phase mode. In one embodiment, "m" is equal to 2^n. For example, m is equal to 8, and n is equal to 3, in an embodiment in which the phase generator 942 may be operated in either a four-phase mode or an eight-phase mode.

Each stage 902 is connected to a physical input of the frequency mixer 710, in one embodiment. Each stage 902 remains connected to the same physical input of the frequency mixer 710 in both the 2^(n−1) phase mode and the 2^n phase mode, in one embodiment. When in the 2^n phase mode, each stage 902 outputs one phase signal of a 2^n phase oscillator signal. For example, stage 902(1) outputs the φ1 signal and stage 902(m) outputs the φm signal, in the 2^n phase mode. When in the 2^(n−1) phase mode, half of the stages 902 output a phase signal of a 2^(n−1) phase oscillator signal. For example, the odd stages may each output one phase signal of the 2^(n−1) phase oscillator signal. The even stages output a logic low signal in one embodiment of the 2^(n−1) phase mode.

Figure 11A:
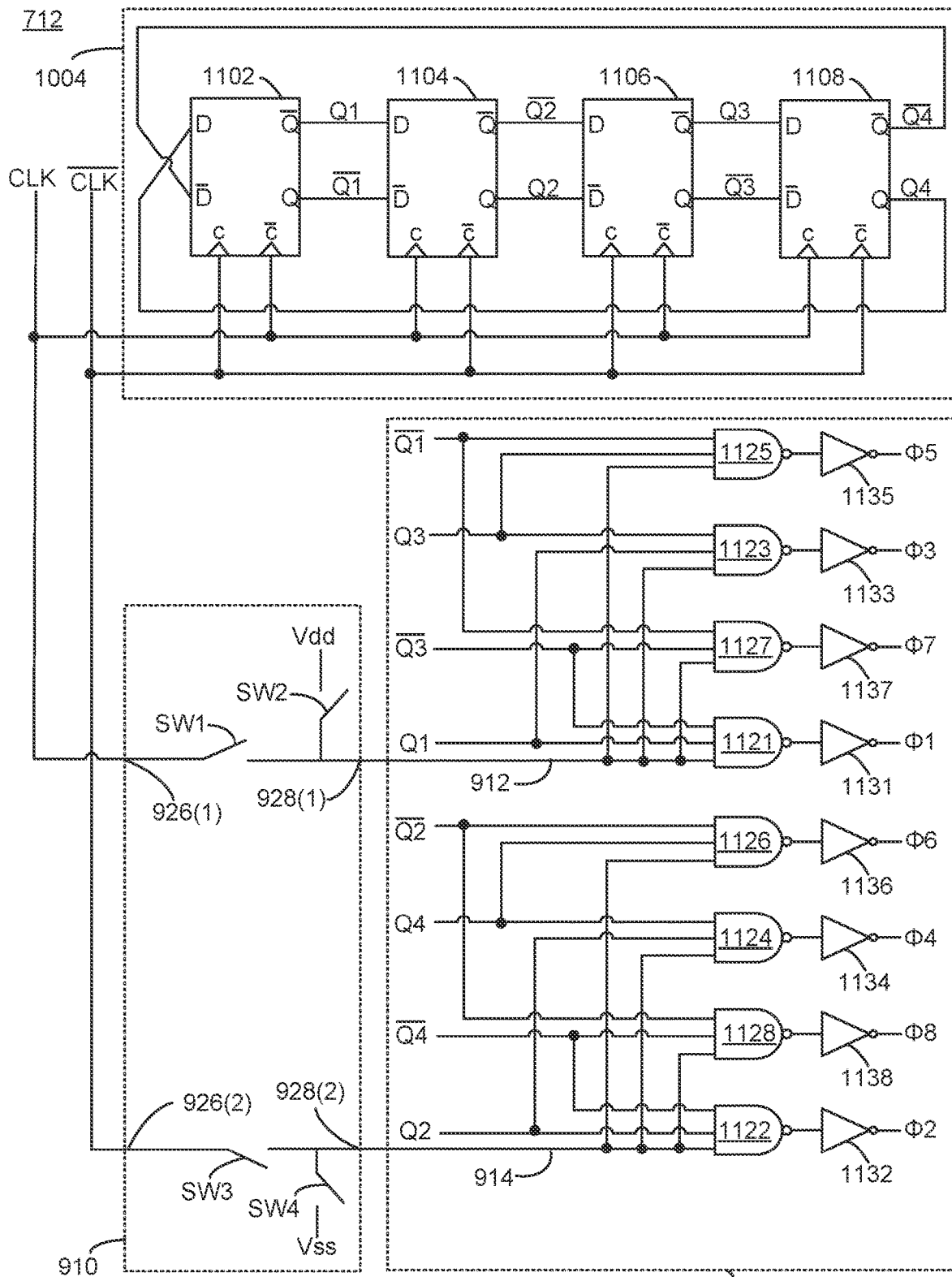
FIG. 11A is a diagram of one embodiment of a phase signal generation circuit.
Figure 11B:
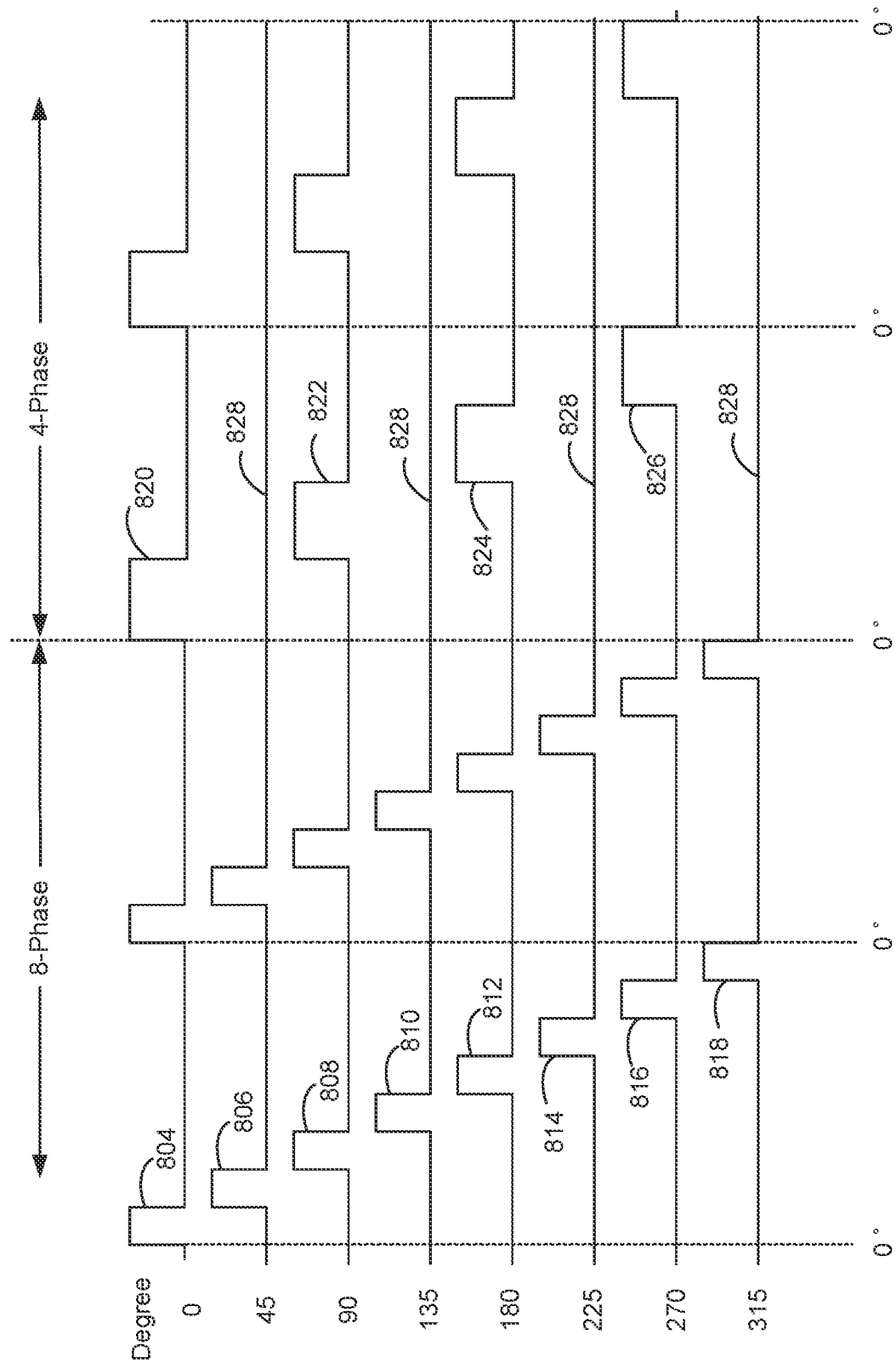
FIG. 11B depicts one possible transition between an eight-phase mode and a four-phase mode for one embodiment of the circuit of FIG. 11A.
Figure 11C:
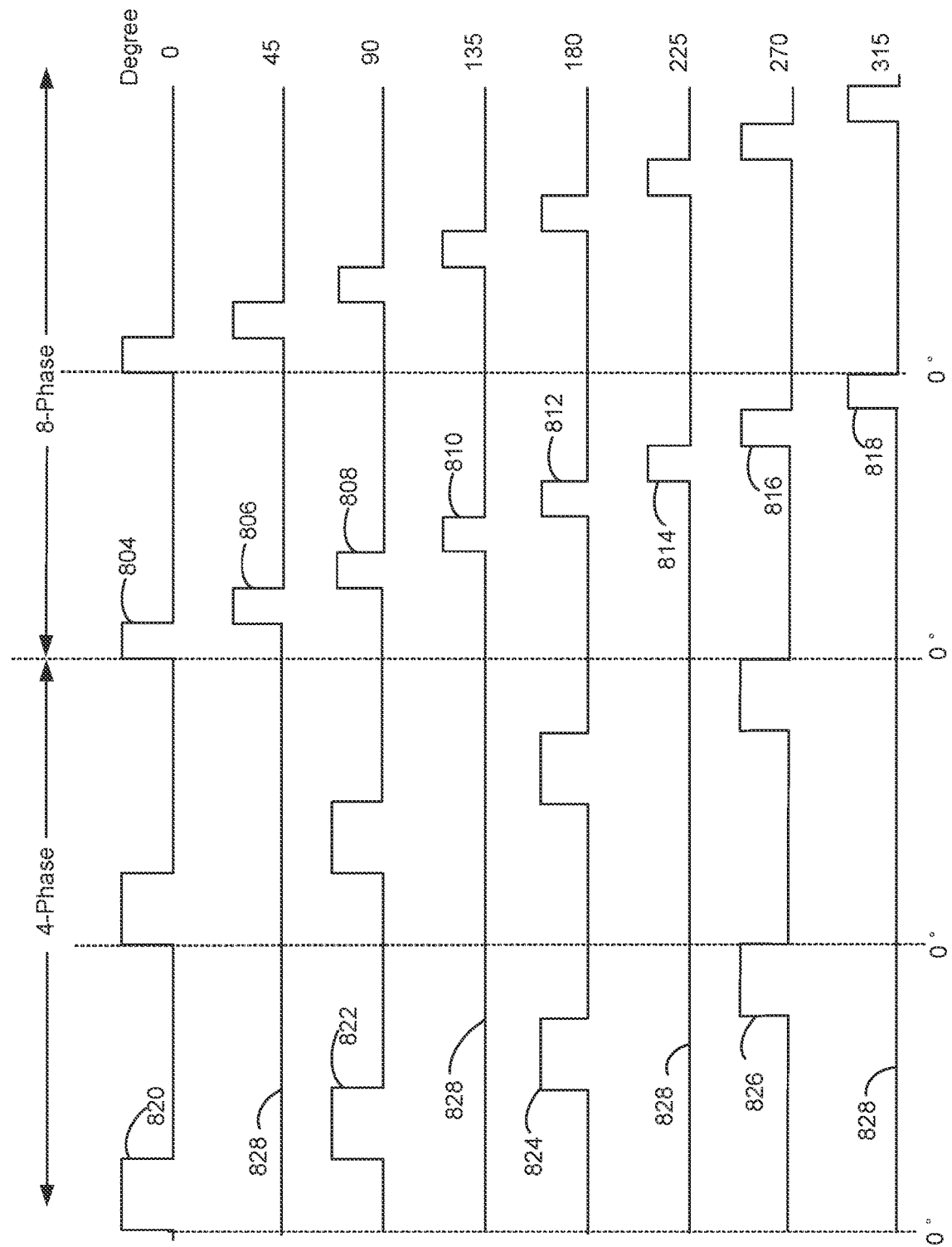
FIG. 11C depicts one possible transition between a four-phase mode and an eight-phase mode for one embodiment of the circuit of FIG. 11A.
Figure 12:
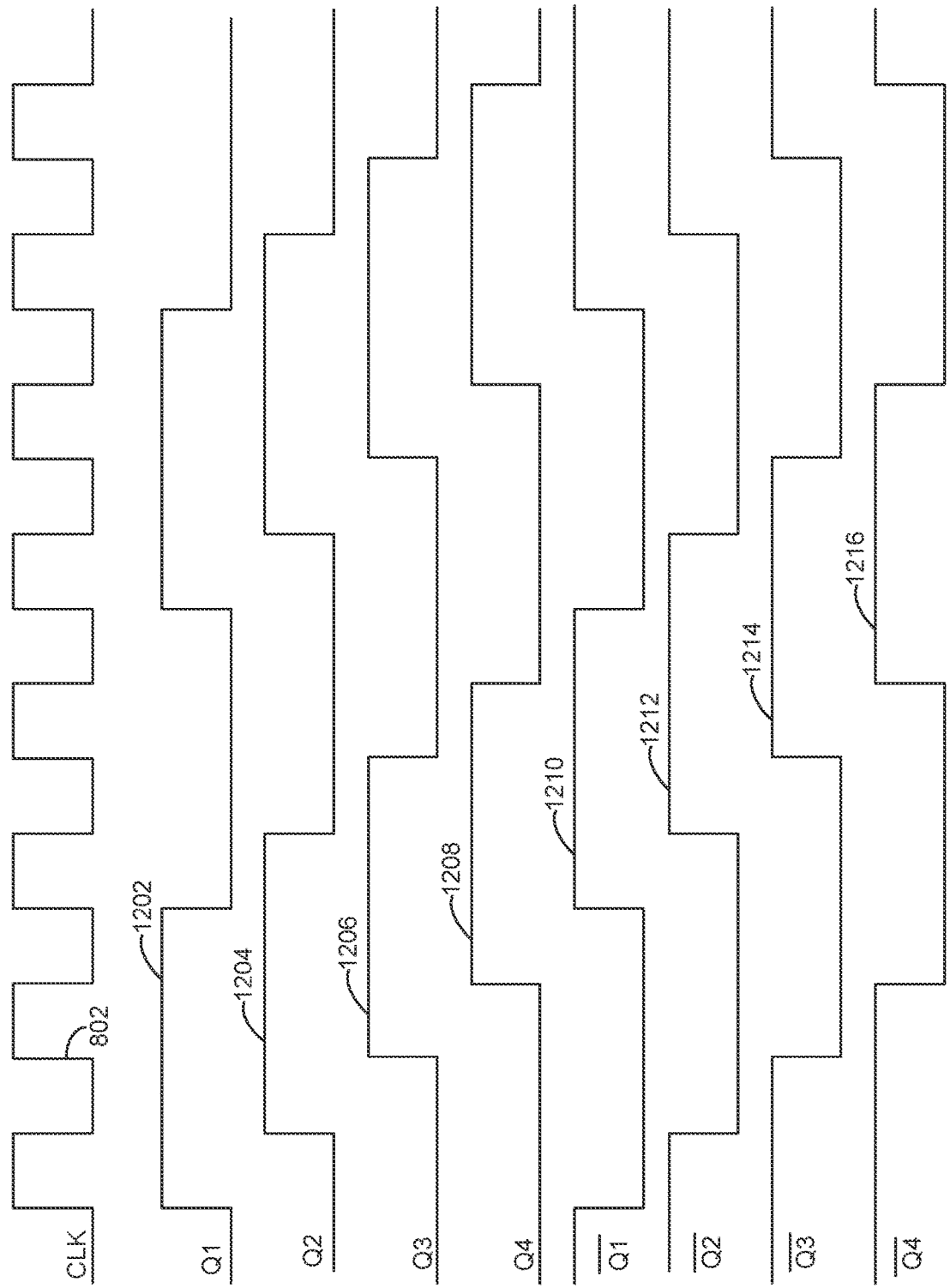
FIG. 12 depicts example waveforms for one embodiment of the circuit of FIG. 11A.

FIG. 11A is a diagram of one embodiment of a phase signal generation circuit 712. The circuit 712 of FIG. 11A may be used for providing either an eight-phase signal or a four-phase signal. When used to provide a multi-phase signal to a frequency mixer, the circuit 712 may provide either an eight-phase local oscillator signal or a four-phase local oscillator signal. The circuit 712 of FIG. 11A is one embodiment of phase signal generation circuit 712 of FIG. 7. The circuit 712 of FIG. 11A depicts further details of one embodiment of phase signal generation circuit 712 of FIG. 9A.

The circuit 712 of FIG. 11A includes a frequency divider 1004, which is one embodiment of the frequency divider 1004 of FIG. 10. The circuit 712 of FIG. 11A includes a controller 910, which is one embodiment of the controller 910 of FIG. 10. Note that the controller 910 may have a mode selection logic 940, such as depicted in FIG. 9B, to control the switches SW1, SW2, SW3, and SW4. However, the mode selection logic 940 is not depicted in FIG. 11A. The circuit 712 of FIG. 11A includes phase signal generation stages 1101, which are one embodiment of phase signal generation stages 902(1)-902(m) of FIG. 10.

The circuit 712 inputs a clock signal (CLK) and a clock bar signal. Note that the clock bar signal is depicted in the drawings with a short bar over the term "CLK." The clock signal (CLK) may be waveform 802 from FIG. 8, which is re-printed in FIG. 12. The clock bar signal may be the inverted form of waveform 802. The clock signal (CLK) is input to the first input 926(1) of controller 910. Thus, the clock signal (CLK) is connected to one terminal of switch SW1. The clock bar signal is input to the second input 926(2) of controller 910. Thus, the clock bar signal is connected to one terminal of switch SW3.

The first output 928(1) of the controller 910 provides the first mode select signal 912 to various stages. The second output 928(2) of the controller 910 provides the second mode select signal 914 to various stages. Operation of switches SW1, SW2, SW3 and SW4 to provide the first and second mode select signals may be similar to operation as described with respect to the controller 910 of FIG. 9A.

In one embodiment of the circuit of FIG. 11A, the first mode select signal 912 is the clock signal 802 for the eight-phase mode, the first mode select signal 912 is Vdd for the four-phase mode, the second mode select signal 914 is clock bar (e.g., the inverted version of CLK) for the eight-phase mode, and the second mode select signal 914 is Vss for the four-phase mode.

The frequency divider 1004 of FIG. 11A may also be referred to as a divide by four circuit. The frequency divider 1004 includes two master-slave flip-fops, which are connected to each other. A first master-slave flip-flop includes a first master latch 1102 and a first slave latch 1104. A second master-slave flip-flop includes a second master latch 1106 and a second slave latch 1108. Each latch 1102-1108 has a D input, a D bar input, a Q output, and a Q bar output. Each latch 1102-1108 has c input ("c") and a c bar input ("c bar"). Note that in the drawings, D bar is represented by a short bar above the letter "D," Q bar is represented by a short bar above the letter "Q," and c bar is represented by a short bar above the letter "c."

The clock signal (CLK) is input to the c bar input of latches 1102 and 1106. The clock signal (CLK) is input to the c input of latches 1104 and 1108. The CLK bar signal is input to the c input of latches 1102 and 1106. The CLK bar signal is input to the c bar input of latches 1104 and 1108.

A signal "Q1" is output by the Q bar output of the first master latch 1102. A signal "Q1 bar" is output by the Q output of the first master latch 1102. A signal "Q2 bar" is output by the Q bar output of the first slave latch 1104. A signal "Q2" is output by the Q output of the first slave latch 1104. A signal "Q3" is output by the Q bar output of the second master latch 1106. A signal "Q3 bar" is output by the Q output of the second master latch 1106. A signal "Q4 bar" is output by the Q bar output of the second slave latch 1104. A signal "Q4" is output by the Q output of the second slave latch 1108. Herein, the signals output by the master latches may be referred to as "master periodic binary signals." Herein, the signals output by the slave latches may be referred to as "slave periodic binary signals."

FIG. 12 depicts waveforms output by the latches, in one embodiment. Waveform 1202 is one embodiment of Q1. Waveform 1204 is one embodiment of Q2. Waveform 1206 is one embodiment of Q3. Waveform 1208 is one embodiment of Q4. Waveform 1210 is one embodiment of Q1 bar. Waveform 1212 is one embodiment of Q2 bar. Waveform 1214 is one embodiment of Q3 bar. Waveform 1216 is one embodiment of Q4 bar.

The various waveforms from the latches are input to certain ones of the stages in the phase signal generation stages 1101. There are eight phase signal generation stages. Collectively, the eight phase signal generation stages output an eight-phase signal, when the stages are operated in an eight-phase mode. One example of an eight-phase oscillator signal are waveforms 804-818 in FIG. 8. The symbols φ1-φ8 at the output of the inverter of each stage indicates which waveform 804-818 is output by that stage in the eight-phase mode.

Collectively, the eight phase signal generation stages output a four-phase signal, when the stages are operated in a four-phase mode. One example of a four-phase signal are waveforms 820-826 in FIG. 8. Note that four of the stages may output waveform 828 in the four-phase mode. The symbols φ1-φ8 at the output of the inverter of each stage indicates which waveform 820-828 is output by that stage in the four-phase mode.

A first stage includes first NAND gate 1121 and first inverter gate 1131. The first NAND gate 1121 inputs Q1 and Q3 bar, which are provided by the frequency divider 1004. Q1 and Q3 bar are one example of signals S1 in FIG. 9A. The first NAND gate 1121 also inputs the first mode select signal 912. When the first mode select signal 912 is the clock signal 802, the first stage outputs waveform 804. When the first mode select signal 912 is Vdd, the first stage outputs waveform 820.

A second stage includes second NAND gate 1122 and second inverter gate 1132. The second NAND gate 1122 inputs Q2 and Q4 bar, which are provided by the frequency divider 1004. Q2 and Q4 bar are one example of signals S2 in FIG. 9A. The second NAND gate 1122 also inputs the second mode select signal 914. When the second mode select signal 914 is the inverted clock signal 802 (also referred to as clock bar), the second stage outputs waveform 806. When the second mode select signal 914 is Vss, the second stage outputs waveform 828.

A third stage includes third NAND gate 1123 and third inverter gate 1133. The third NAND gate 1123 inputs Q1 and Q3, which are provided by the frequency divider 1004. Q1 and Q3 bar are one example of signals S3 in FIG. 9A. The third NAND gate 1123 also inputs the first mode select signal 912. When the third mode select signal 912 is the clock signal 802, the third stage outputs waveform 808. When the third mode select signal 912 is Vdd, the third stage outputs waveform 822.

A fourth stage includes fourth NAND gate 1124 and fourth inverter gate 1134. The fourth NAND gate 1124 inputs Q2 and Q4, which are provided by the frequency divider 1004. Q2 and Q4 are one example of signals S4 in FIG. 9A. The fourth NAND gate 1124 also inputs the fourth mode select signal 914. When the second mode select signal 914 is the inverted clock signal 802 (also referred to as clock bar), the fourth stage outputs waveform 810. When the second mode select signal 914 is Vss, the fourth stage outputs waveform 828.

A fifth stage includes fifth NAND gate 1125 and fifth inverter gate 1135. The fifth NAND gate 1125 inputs Q1 bar and Q3, which are provided by the frequency divider 1004. Q1 bar and Q3 are one example of signals S5 in FIG. 9A. The fifth NAND gate 1125 also inputs the first mode select signal 912. When the first mode select signal 912 is the clock signal 802, the fifth stage outputs waveform 812. When the first mode select signal 912 is Vdd, the fifth stage outputs waveform 824.

A sixth stage includes sixth NAND gate 1126 and sixth inverter gate 1136. The sixth NAND gate 1126 inputs Q2 bar and Q4, which are provided by the frequency divider 1004. Q2 bar and Q4 are one example of signals S6 in FIG. 9A. The sixth NAND gate 1126 also inputs the second mode select signal 914. When the second mode select signal 914 is the inverted clock signal 802 (also referred to as clock bar), the sixth stage outputs waveform 814. When the second mode select signal 914 is Vss, the second stage outputs waveform 828.

A seventh stage includes seventh NAND gate 1127 and seventh inverter gate 1137. The seventh NAND gate 1127 inputs Q1 bar and Q3 bar, which are provided by the frequency divider 1004. Q1 bar and Q3 bar are one example of signals S7 in FIG. 9A. The seventh NAND gate 1127 also inputs the first mode select signal 912. When the first mode select signal 912 is the clock signal 802, the seventh stage outputs waveform 816. When the first mode select signal 912 is Vdd, the seventh stage outputs waveform 826.

An eighth stage includes eighth NAND gate 1128 and eighth inverter gate 1138. The eighth NAND gate 1128 inputs Q2 bar and Q4 bar, which are provided by the frequency divider 1004. Q2 bar and Q4 bar are one example of signals S8 in FIG. 9A. The eighth NAND gate 1128 also inputs the second mode select signal 914. When the second mode select signal 914 is the inverted clock signal 802 (also referred to as clock bar), the eighth stage outputs waveform 818. When the second mode select signal 914 is Vss, the eighth stage outputs waveform 828.

The implementation of the stages with NAND gates and inverter gates, as depicted in FIG. 11A, is one embodiment. The stages are implemented with different types of logic gates in other embodiments. The stages may include elements other than and/or in addition to logic gates, in some embodiments.

The transition between the four-phase signal and the eight-phase signal is seamless, in one embodiment. For example, there is a small, deterministic phase shift, in one embodiment. FIG. 11B depicts one possible transition between the eight-phase signal and the four-phase signal for one embodiment of the circuit of FIG. 11A. The diagram depicts the waveforms output by the eight stages. Stage 1 outputs waveform 804 during the 8-phase mode and seamlessly transitions to waveform 820 in the four-phase mode. FIG. 11B shows that waveform 820 transitions from low to high at the dashed lines labeled 0 degrees, which is the same the waveform 804. It is not required that both waveforms 804, 820 transition from low to high at exactly the 0 degree lines. For example, there may be some small deviation from zero degrees due to, for example, delays in components (e.g., logic gates). However, because waveform 804 and waveform 820 are each generated based on the same periodic binary signals from the frequency divider 1004, the transition from low to high will be very close to the 0 degree lines, in one embodiment. Hence, unlike the indeterministic phase shift 680 depicted in the example of FIG. 6B, there is a deterministic phase shift when transitioning from the eight-phase signal to the four-phase signal, in one embodiment. Moreover, the phase shift is zero degrees, in one embodiment. As noted, there may be some small deviation from zero degrees due to, for example, delays in components (e.g., logic gates).

Stage 2 outputs waveform 806 during the 8-phase mode and seamlessly transitions to waveform 828 in the four-phase mode. Stage 3 outputs waveform 808 during the 8-phase mode and seamlessly transitions to waveform 822 in the four-phase mode. Stage 4 outputs waveform 810 during the 8-phase mode and seamlessly transitions to waveform 828 in the four-phase mode. Stage 5 outputs waveform 812 during the 8-phase mode and seamlessly transitions to waveform 824 in the four-phase mode. Stage 6 outputs waveform 814 during the 8-phase mode and seamlessly transitions to waveform 828 in the four-phase mode. Stage 7 outputs waveform 816 during the 8-phase mode and seamlessly transitions to waveform 826 in the four-phase mode. Stage 8 outputs waveform 818 during the 8-phase mode and seamlessly transitions to waveform 828 in the four-phase mode. There are also deterministic phase shifts when transitioning from the eight-phase signal to the four-phase signal for stages 2-8, in one embodiment. Moreover, the phase shifts are each zero degrees, in one embodiment. There may be some small deviation from zero degrees due to, for example, delays in components (e.g., logic gates).

FIG. 11C depicts one possible transition between the four-phase signal and the eight-phase signal for one embodiment of the circuit of FIG. 11A. The diagram depicts the waveforms output by the eight stages. Stage 1 outputs waveform 820 during the 4-phase mode and seamlessly transitions to waveform 804 in the 8-phase mode. FIG. 11C shows that waveform 804 transitions from low to high at the dashed lines labeled 0 degrees, which is the same the waveform 820. It is not required that both waveforms 820, 804 transition from low to high at exactly the 0 degree lines. For example, there may be some small deviation from zero degrees due to, for example, delays in components (e.g., logic gates). However, because waveform 820 and waveform 804 are each generated based on the same periodic binary signals from the frequency divider 1004, the transition from low to high will be very close to the 0 degree lines, in one embodiment. Hence, there is a deterministic phase shift when transitioning from the four-phase signal to the eight-phase signal, in one embodiment. Moreover, the phase shift is zero degrees, in one embodiment. As noted, there may be some small deviation from zero degrees due to, for example, delays in components (e.g., logic gates).

Stage 2 outputs waveform 828 during the 4-phase mode and seamlessly transitions to waveform 806 in the 8-phase mode. Stage 3 outputs waveform 822 during the 4-phase mode and seamlessly transitions to waveform 808 in the 8-phase mode. Stage 4 outputs waveform 828 during the 4-phase mode and seamlessly transitions to waveform 810 in the 8-phase mode. Stage 5 outputs waveform 824 during the 4-phase mode and seamlessly transitions to waveform 812 in the 8-phase mode. Stage 6 outputs waveform 828 during the 4-phase mode and seamlessly transitions to waveform 814 in the 8-phase mode. Stage 7 outputs waveform 826 during the 4-phase mode and seamlessly transitions to waveform 816 in the 8-phase mode. Stage 8 outputs waveform 828 during the 4-phase mode and seamlessly transitions to waveform 818 in the 8-phase mode. There are also deterministic phase shifts when transitioning from the four-phase signal to the eight-phase signal for stages 2-8, in one embodiment. Moreover, the phase shifts are each zero degrees, in one embodiment. As noted, there may be some small deviation from zero degrees due to, for example, delays in components (e.g., logic gates).

The deterministic phase shifts when transitioning between the four-phase signals and eight-phase signals allows the transition to be made while four-phase signals and eight-phase signals are being used, in one embodiment. For example, the transitions can be made while the four-phase signals and eight-phase signals are being provided to a frequency mixer. Thus, the transitions between the four-phase signals and eight-phase signals can be made, for example, while a wireless communication device is processing a signal. As one example, the transitions between the four-phase signals and eight-phase signals can be made while a cellular telephone is transmitting a wireless signal.

FIG. 13 is a flowchart of one embodiment of a process 1300 of operating a phase signal generation circuit 712. The process 1300 is performed by the phase signal generation circuit 712, in one embodiment. The process 1300 is performed in a radio receiver, in one embodiment. Process 1300 may be performed by radio receiver 204 or 304, but is not limited to those radio receivers. Process 1300 may be performed by a direct conversion receiver (e.g., DCR 404), or a superheterordyne receiver, but is not limited thereto. The process 1300 is performed in a radio transmitter, in one embodiment. Process 1300 may be performed by radio transmitter 202 or 302, but is not limited to those radio transmitters. Process 1300 may be performed by a direct conversion transmitter (e.g., transmitter 502), or a superheterordyne transmitter, but is not limited thereto.

The phase signal generation circuit 712 has $2^n$ phase signal generation stages 902, wherein "n" is an integer greater than 1. There are $2^{(n-1)}$ odd stages and $2^{(n-1)}$ even stages, in one embodiment. The process 1300 is described in a certain order as a matter of convenience. Step 1302 may occur before and/or after step 1304. Thus, the order of the steps could be reversed.

Step 1302 includes providing a mode input 922 of each of the $2^n$ phase signal generation stages 902 with an active periodic binary signal with remaining inputs 924 of each of the $2^n$ stages provided with another periodic binary signal to generate $2^n$ phase signals in a first mode. The first mode may be referred to as a $2^n$ mode.

In one embodiment of step 1302, the active periodic binary signal is a version of the clock signal 802. For example, the mode input 922 of the $2^{(n-1)}$ odd stages may be provided with the clock signal 802, whereas the mode input 922 of the $2^{(n-1)}$ even stages may be provided with an inverted version of the clock signal 802.

In one embodiment of step 1302, the remaining inputs of each of the $2^n$ stages are each provided with two of the waveforms 1202-1216 depicted in FIG. 12. The remaining inputs refers to the fixed inputs 924, in one embodiment. In one embodiment of step 1302, the remaining inputs 924 of each of the $2^n$ stages are each provided with signals from the frequency divider 1004, in accordance with the depiction in FIG. 11A.

Step 1304 includes providing the mode input 922 of each of the $2^{(n-1)}$ odd stages with a first steady state signal and the mode input of each of the $2^{(n-1)}$ even stages with a second steady state signal with remaining inputs 924 of each of the $2^n$ stages provided with the same periodic binary signal as in the first mode to cause either the $2^{(n-1)}$ odd stages or the $2^{(n-1)}$ even stages to generate $2^{(n-1)}$ phase signals in a second mode.

In one embodiment of step 1304, the first steady state signal that is provided to the mode input 922 of each of the $2^{(n-1)}$ odd stages is a logic high signal (e.g., Vdd). In one embodiment of step 1304, the second steady state signal that is provided to the mode input 922 of each of the $2^{(n-1)}$ even stages is a logic low signal (e.g., Vss).

Switching from the active periodic binary signal (e.g., CLK) to the first steady state signal transitions the odd stages from the $2^n$ phase mode to the $2^{(n-1)}$ phase mode, in one embodiment. Moreover, this transition may be seamless. For example, there may be a small and deterministic phase shift as discussed, for example, with respect to FIGS. 11B and 11C.

FIG. 14 is a flowchart of one embodiment of a process 1400 of providing periodic binary signals to phase signal generation stages 902. The process 1400 may be used in connection with step 1302 of process 1300. The process 1400 is performed by the phase signal generation circuit 712, in one embodiment. The process 1400 is performed in a radio receiver, in one embodiment. Process 1400 may be performed by radio receiver 204 or 304, but is not limited to those radio receivers. Process 1400 may be performed by a direct conversion receiver (e.g., DCR 404), or a superheterordyne receiver, but is not limited thereto. The process 1400 is performed in a radio transmitter, in one embodiment. Process 1500 may be performed by radio transmitter 202 or 302, but is not limited to those radio transmitters. Process 1400 may be performed by a direct conversion transmitter (e.g., transmitter 502), or a superheterordyne transmitter, but is not limited thereto.

Step 1402 includes dividing a frequency of a clock signal to produce periodic binary signals. In one embodiment, the frequency divider 1004 of FIG. 11A is used to produce the periodic binary signals. The clock signal is clock signal 802 (see FIG. 12) and the periodic binary signals are waveforms 1202-1216, in one embodiment.

Step 1404 includes providing a first version of the clock signal as the active periodic binary signal to the mode input 922 of the $2^{\wedge}(n-1)$ odd stages 902. In one embodiment, the clock signal 802 is provided to the mode input 922 of the $2^{\wedge}(n-1)$ odd stages 902.

Step 1406 includes providing a second version of the clock signal as the active periodic binary signal to the mode input 922 of the $2^{\wedge}(n-1)$ even stages 902. In one embodiment, an inverted version of the clock signal 802 is provided to the mode input 922 of the $2^{\wedge}(n-1)$ even stages 902.

Figure 15:
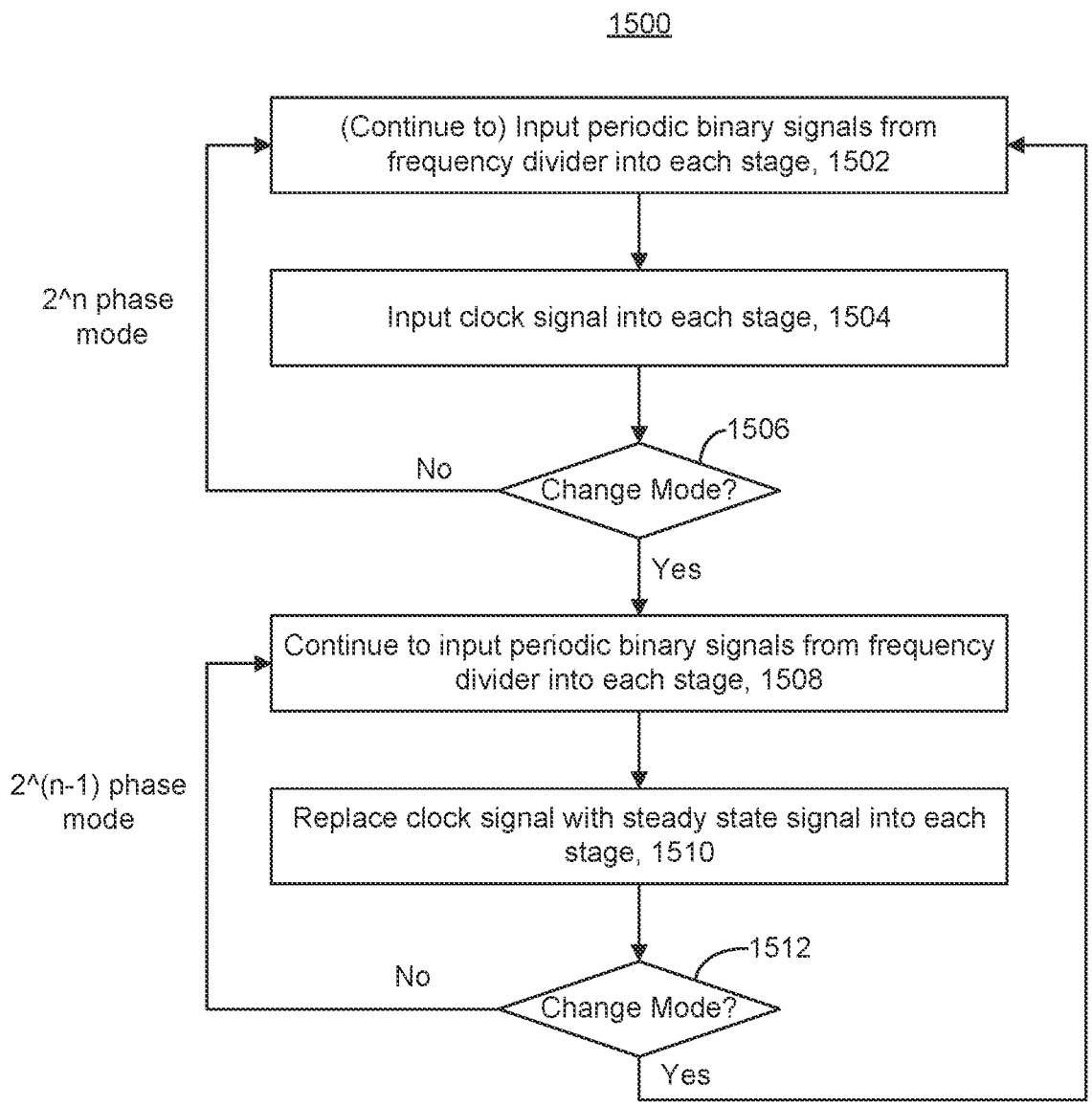
FIG. 15 is a flowchart of one embodiment of a process of transitioning between a $2^n$ phase mode and a $2^{(n-1)}$ phase mode.

FIG. 15 is a flowchart of one embodiment of a process 1500 of transitioning between the $2^{\wedge}n$ phase mode and the $2^{\wedge}(n-1)$ phase mode. The process 1500 is performed by the phase signal generation circuit 712, in one embodiment. The process 1500 is performed in a radio receiver, in one embodiment. Process 1500 may be performed by radio receiver 204 or 304, but is not limited to those radio receivers. Process 1500 may be performed by a direct conversion receiver (e.g., DCR 404), or a superheterordyne receiver, but is not limited thereto. The process 1500 is performed in a radio transmitter, in one embodiment. Process 1500 may be performed by radio transmitter 202 or 302, but is not limited to those radio transmitters. Process 1500 may be performed by a direct conversion transmitter (e.g., transmitter 502), or a superheterordyne transmitter, but is not limited thereto.

Step 1502 includes inputting periodic binary signals from the frequency divider 1004 into each phase signal generation stage 902. At some point at time, the phase signal generation circuit 712 is started. For example, the phase signal generation circuit 712 may be started when a wireless communication device (containing the circuit 712) is powered on. However, the phase signal generation circuit 712 may then continually operate, such that the frequency divider 1004 continues to generate the periodic binary signals, which are then provided to the various phase signal generation stages 902. This helps to facilitate a seamless transition between the $2^{\wedge}n$ phase mode and a $2^{\wedge}(n-1)$ phase mode.

Step 1504 includes inputting a clock signal 802 into each stage 902. In one embodiment, clock signal 802 is input to the mode input 922 of each odd stage, and an inverted version of the clock signal 802 is input to the mode input 922 of each even stage. Thus, the phrase, "inputting a clock signal into each stage" includes inputting either the clock signal or an inverted version of the clock signal.

Step 1506 includes a determination of whether to switch modes. The determination is based on a power level consumption of an electronic device that contains the phase signal generation circuit 712, in one embodiment. For example, the switch may be made based on a power level of a cellular telephone. In one embodiment, this is based on a power level of RF output 518. In one embodiment, a power level greater than a threshold indicates that the $2^{\wedge}n$ phase mode (e.g., eight-phase mode) should be used, and power level less than the threshold indicates that the $2^{\wedge}(n-1)$ phase mode (e.g., four-phase mode) should be used. Operating in the $2^{\wedge}n$ phase mode reduces distortion, in one embodiment. For example, operating in an eight-phase mode may reduce distortion in an RF signal transmitted by a wireless communication device. Operating in the $2^{\wedge}(n-1)$ phase mode reduces power consumption (relative to the $2^{\wedge}n$ phase mode), in one embodiment. For example, operating in a four-phase mode may reduce power consumption (relative to the eight-phase mode) in the wireless communication device.

In response to determining that a transition should not be made to the $2^{\wedge}(n-1)$ phase mode, the process 1500 continues to perform steps 1502 and 1504.

In response to determining that a transition should be made to the $2^{\wedge}(n-1)$ phase mode, the process 1500 continues at step 1508. Step 1508 includes continuing to input the periodic binary signals from the frequency divider 1004 into each phase signal generation stage 902.

Step 1510 includes replacing the clock signal 802 at the mode inputs 922 of the stages with a steady state signal. In one embodiment, a first steady state signal (e.g., SS1) is input to the $2^{\wedge}(n-1)$ odd stages 902, and a second steady state signal (e.g., SS2) is input to the $2^{\wedge}(n-1)$ even stages 902. In one embodiment, the first steady state signal is a logic high signal (e.g., Vdd). In one embodiment, the second steady state signal is a logic low signal (e.g., Vss).

Step 1512 includes a determination of whether to switch modes. This step may be made on similar considerations as discussed above with respect to step 1506. For example, the switch may be made based on a power level of a transmitter of a cellular telephone. In response to determining that a transition should not be made to the $2^{\wedge}n$ mode, the process continues with steps 1508 and 1510. In response to determining that a transition should be made to the $2^{\wedge}n$ mode, the process continues with steps 1502 and 1504.

One embodiment includes an apparatus comprising: a buffer; a clock generator connected to the buffer; a frequency divider configured to divide a frequency of the clock signal to produce periodic binary signals; $2^{\wedge}n$ phase signal generation stages each, the $2^{\wedge}n$ stages comprising $2^{\wedge}(n-1)$ odd stages and $2^{\wedge}(n-1)$ even stages, wherein "n" is an integer greater than 1; and a controller configured to switch the $2^{\wedge}n$ phase signal generation stages between a first mode and a second mode, in the first mode the $2^{\wedge}n$ stages collectively generate a $2^{\wedge}n$ phase signal based on the clock signal and the periodic binary signals, in the second mode either the $2^{\wedge}(n-1)$ odd stages or the $2^{\wedge}(n-1)$ even stages collectively generate a $2^{\wedge}(n-1)$ phase signal based on the periodic binary signal. The clock generator is configured to provide the clock signal through the buffer in both the first mode and in the second mode, wherein the buffer provides the same load on the clock generator in the first mode and in the second mode.

One embodiment includes a method comprising providing a clock signal from a clock generator to a frequency divider along the same electrical path in both a first mode and in a second mode in order to maintain the same load on the clock generator in both the first mode and the second mode; dividing a frequency of the clock signal, by the frequency divider, to produce periodic binary signals; generating a $2^{\wedge}n$ phase signal based on the clock signal and the periodic binary signals in the first mode; and generating a $2^{\wedge}(n-1)$ phase signal based on the periodic binary signals in the second mode.

The technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special-purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A transmitter, comprising:
   a low pass filter, configured to receive and filter a signal produced by a digital to analog converter and to output the filtered signal to a mixer;
   a local oscillator comprising a clock generator and a phase generator circuit, wherein the clock generator is configured to provide a clock signal to the phase generator circuit, wherein the phase generator circuit is configured to output a $2^{(n-1)}$ phase oscillator signal and a $2^n$ phase oscillator signal to the mixer, the phase generator circuit comprising $2^n$ stages configured to generate the $2^n$ phase oscillator signal, the $2^n$ stages comprising $2^{(n-1)}$ stages configured to generate the $2^{(n-1)}$ phase oscillator signal, wherein n is an integer greater than 1; and
   wherein the phase generator circuit is coupled to the mixer through an electrical path that is configured to conduct both the $2^{(n-1)}$ phase oscillator signal and the $2^n$ phase oscillator signal, wherein the mixer is configured to receive the $2^{(n-1)}$ phase oscillator signal and the $2^n$ phase oscillator signal through overlapped input.

2. The transmitter of claim 1, wherein the mixer comprises first nodes that are selectively configured to receive all phase signals of the $2^{(n-1)}$ phase oscillator signal, or to selectively receive all of the phase signals of the $2^n$ phase oscillator signal.

3. The transmitter of claim 1, further comprising:
   a mode selector, configured to select between the $2^{(n-1)}$ phase oscillator signal and the $2^n$ phase oscillator signal.

4. The transmitter of claim 1, wherein the electrical path comprises:
   $2 2^{(n+1)}$ electrical lines, wherein the $2^n$ phase signal is provided to the mixer through the $2^{(n-1)}$ electrical lines as a differential $2^n$ phase signal.

5. The transmitter of claim 4, wherein the $2^{(n-1)}$ phase signal is provided to the mixer through a subset of the $2^{(n+1)}$ electrical lines as a $2^{(n-1)}$ phase differential signal.

6. The transmitter of claim 1, wherein each stage of the $2^n$ stages comprise a mode input, wherein the mode input is configured to select the $2^{(n-1)}$ stages to generate the $2^{(n-1)}$ phase oscillator signal and to select the $2^n$ stages to generate the $2^n$ phase oscillator signal.

7. The transmitter of claim 6, further comprising a controller that is configured to provide a mode control signal to the mode input.

8. The transmitter of claim 7, wherein the mode control signal comprises a steady state signal and a periodic binary signal.

9. The transmitter of claim 8, wherein the controller is configured to provide the steady state signal to enable the output of the $2^{(n-1)}$ phase oscillator signal.

10. The transmitter of claim 9, wherein the steady state signal comprises a first steady state signal and a second steady state signal.

11. The transmitter of claim 10, wherein the first steady state signal is a logic high signal and a second steady state signal is a logic low signal.

12. The transmitter of claim 11, wherein the first steady state signal is set to a voltage of VDD and the second steady state signal remains at a voltage of VSS.

13. The transmitter of claim 12, wherein:
the mode control signal comprises a first mode control signal and a second mode control signal; and
the first mode control signal is provided to a first part of the $2^n$ stages and the second mode control signal is provided to a second part of the $2^n$ stages.

14. The transmitter of claim 13, wherein:
the first mode control signal is output as the periodic binary signal to generate the $2^n$ phase oscillator signal; and
wherein the first mode control signal is output as the VDD to generate the $2^{(n-1)}$ phase oscillator signal.

15. The transmitter of claim 14, wherein:
the second mode control signal is output as the periodic binary signal to generate the $2^n$ phase oscillator signal; and
the second mode control signal is output as the VSS to generate the $2^{(n-1)}$ phase oscillator signal.

16. The transmitter of claim 1, wherein:
the $2^{(n-1)}$ phase oscillator signal is a four-phase oscillator signal; and
the $2^n$ phase oscillator signal oscillator signal is an eight-phase oscillator signal.

17. A receiver, comprising:
an amplifier configured to receive and amplify a radio frequency signal, the amplifier configured to output the amplified radio frequency signal to a mixer;
a local oscillator comprising a clock generator and a phase generator circuit, wherein the clock generator is configured to provide a clock signal to the phase generator circuit, wherein the phase generator circuit is configured to output a $2^{(n-1)}$ phase oscillator signal and a $2^n$ phase oscillator signal to the mixer, wherein the phase generator circuit comprises $2^n$ stages configured to generate the $2^n$ phase oscillator signal, wherein the $2^n$ stages include $2^{(n-1)}$ stages configured to generate the $2^{(n-1)}$ phase oscillator signal, wherein n is an integer greater than 1; and
wherein the phase generator circuit is coupled to the mixer through an electrical path that is configured to conduct both the $2^{(n-1)}$ phase oscillator signal and the $2^n$ phase oscillator signal.

18. A signal reception method, comprising:
receiving a radio frequency signal;
amplifying the received radio frequency signal to produce an amplified radio frequency signal;
providing the amplified radio frequency signal to a mixer;
providing a clock signal to a phase generator circuit;
generating a $2^{(n-1)}$ phase oscillator signal and a $2^n$ phase oscillator signal by the phase generator circuit, including generating the $2^n$ phase oscillator signal with $2^n$ stages of the phase generator circuit and generating the $2^{(n-1)}$ phase oscillator signal with $2^{(n-1)}$ stages of the $2^n$ stages of the phase generator circuit, wherein n is an integer greater than 1; and
providing the $2^{(n-1)}$ phase oscillator signal and the $2^n$ phase oscillator signal from the phase generator circuit to the mixer over an electrical path that is configured to conduct both the $2^{(n-1)}$ phase oscillator signal and the $2^n$ phase oscillator signal.

* * * * *

UNITED STATES PATENT AND TRADEMARK OFFICE
CERTIFICATE OF CORRECTION

| | | |
|---|---|---|
| PATENT NO. | : 12,124,289 B2 | Page 1 of 1 |
| APPLICATION NO. | : 18/460344 | |
| DATED | : October 22, 2024 | |
| INVENTOR(S) | : L. Connell et al. | |

It is certified that error appears in the above-identified patent and that said Letters Patent is hereby corrected as shown below:

In the Claims

Column 32, Line 65, (Claim 4, Lines 2-3): After "comprises" and before "electrical" delete "$22^{(n+1)}$" and insert -- $2^{(n+1)}$ --.

Signed and Sealed this
Nineteenth Day of November, 2024

Katherine Kelly Vidal
*Director of the United States Patent and Trademark Office*